(12) United States Patent
Park et al.

(10) Patent No.: US 11,569,300 B2
(45) Date of Patent: Jan. 31, 2023

(54) DISPLAY DEVICE

(71) Applicant: Samsung Display Co., LTD., Yongin-si (KR)

(72) Inventors: Juchan Park, Seoul (KR); Sunho Kim, Seongnam-si (KR); Ja Eun Lee, Suwon-si (KR); Gun Hee Kim, Seoul (KR); Jieun Kim, Cheonan-si (KR); Sun Hee Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/693,453

(22) Filed: Mar. 14, 2022

(65) Prior Publication Data

US 2022/0320192 A1 Oct. 6, 2022

(30) Foreign Application Priority Data

Mar. 23, 2021 (KR) ........................ 10-2021-0037524

(51) Int. Cl.
*G09G 3/3233* (2016.01)
*H01L 27/32* (2006.01)

(52) U.S. Cl.
CPC ....... *H01L 27/3216* (2013.01); *G09G 3/3233* (2013.01); *H01L 27/3218* (2013.01); *G09G 2300/0452* (2013.01)

(58) Field of Classification Search
CPC ............ H01L 27/3216; H01L 27/3218; G09G 3/3233; G09G 2300/0452
See application file for complete search history.

(56) References Cited

U.S. PATENT DOCUMENTS

| | | | |
|---|---|---|---|
| 9,946,123 B2 | 4/2018 | Huangfu et al. | |
| 10,147,777 B2 * | 12/2018 | Lim | ..................... G09G 3/3233 |
| 10,607,534 B2 | 3/2020 | Tian et al. | |
| 10,848,750 B2 | 11/2020 | Kwon et al. | |
| 2011/0050645 A1 * | 3/2011 | Lee | ..................... H01L 27/3211 |
| | | | 257/E33.077 |

(Continued)

FOREIGN PATENT DOCUMENTS

| | | |
|---|---|---|
| KR | 10-2016-0111899 | 9/2016 |
| KR | 10-2018-0018960 | 2/2018 |

(Continued)

*Primary Examiner* — Jeff Piziali
(74) *Attorney, Agent, or Firm* — H.C. Park & Associates, PLC

(57) ABSTRACT

A display device includes a first display area and a second display area located on opposite sides of a display area. The display device includes first through third sub-pixels. The first through third sub-pixels are disposed in the first and second display areas. The first and second sub-pixels are arranged in a first column adjacent to a first boundary, and the third sub-pixels are arranged in a second column. The second and first sub-pixels are arranged in a third column adjacent to a second boundary, and the third sub-pixels are arranged in a fourth column. The third sub-pixels are arranged in a first column and a second column of the first sub-area. The first and second sub-pixels are arranged in a first column and a second column of the third sub-area. The first to third sub-pixels are not disposed in the second column of the first and third sub-areas.

20 Claims, 21 Drawing Sheets

(56) References Cited

U.S. PATENT DOCUMENTS

| | | | |
|---|---|---|---|
| 2014/0340402 A1* | 11/2014 | Hamagishi | G02B 30/24 |
| | | | 345/426 |
| 2016/0357076 A1* | 12/2016 | Huangfu | G02F 1/1368 |
| 2016/0358543 A1* | 12/2016 | Rappoport | G09G 3/3225 |
| 2018/0115771 A1* | 4/2018 | Kwon | G09G 3/3233 |
| 2019/0206310 A1* | 7/2019 | Tian | H01L 27/3218 |
| 2020/0098835 A1* | 3/2020 | Bae | G09G 3/3607 |
| 2021/0314555 A1* | 10/2021 | Kim | H04N 13/324 |

FOREIGN PATENT DOCUMENTS

| | | |
|---|---|---|
| KR | 10-2018-0044454 | 5/2018 |
| KR | 10-2019-0036461 | 4/2019 |
| KR | 10-2020-0034290 | 3/2020 |

* cited by examiner

DISPLAY DEVICE

CROSS-REFERENCE TO RELATED APPLICATION

This application claims priority from and the benefit of Korean Patent Application No. 10-2021-0037524, filed on Mar. 23, 2021, which is hereby incorporated by reference for all purposes as if fully set forth herein.

BACKGROUND

Field

Embodiments of the invention relate generally to a display device. More particularly, embodiments of the invention relate to a display device including sub-pixels of different sizes.

Discussion of the Background

Flat panel display devices are used as display devices for replacing a cathode ray tube display device due to lightweight and thin characteristics thereof. As representative examples of such flat panel display devices, there are a liquid crystal display device and an organic light emitting diode display device.

Such a display device may include a display area in which an image is displayed and a peripheral area in which the image is not displayed. For example, sub-pixels may be disposed in the display area. In this case, the sub-pixels may be arranged in the display area in a PenTile™ scheme in which red/green-blue/green (RG-BG) sub-pixels are repeatedly arranged in a row direction. Furthermore, the peripheral area may be located on both sides of the display area. For example, a gate driver, an emission signal driver, and the like may be disposed in the peripheral area.

Recently, a display device in which sub-pixels are formed in a peripheral area to display an image even in the peripheral area has been developed. In this case, the display device may be configured such that sizes of the sub-pixels disposed in the display area are different from sizes of the sub-pixels disposed in the peripheral area, respectively.

The above information disclosed in this Background section is only for understanding of the background of the inventive concepts, and, therefore, it may contain information that does not constitute prior art.

SUMMARY

Devices constructed according to embodiments of the invention are capable of improving image quality of a device by having sub-pixels overlap pixel circuits.

Additional features of the inventive concepts will be set forth in the description which follows, and in part will be apparent from the description, or may be learned by practice of the inventive concepts.

Embodiments provide a display device including sub-pixels.

According to embodiments of the inventive concepts, a display device includes a display area, a first display area located in one side of the display area and including a first sub-area and a second sub-area, and a second display area located in an opposite side of the display area and including a third sub-area and a fourth sub-area. The display device includes a substrate and a plurality of first, second, and third sub-pixels. The first, second, and third sub-pixels are disposed in the display area, the first display area, and the second display area on the substrate. The first and second sub-pixels are repeatedly arranged in a first column of the display area that is adjacent to a first boundary between the display area and the first sub-area, and the third sub-pixels are arranged in a second column of the display area. The second and first sub-pixels are repeatedly arranged in a third column of the display area that is adjacent to a second boundary between the display area and the third sub-area, and the third sub-pixels are arranged in a fourth column of the display area. The third sub-pixels are arranged in a first column of the first sub-area that is adjacent to the first boundary, and a second column of the first sub-area is located between the first boundary and the first column of the first sub-area. The first and second sub-pixels are arranged in a first column of the third sub-area that is adjacent to the second boundary, and a second column of the third sub-area is located between the second boundary and the first column of the third sub-area. The first to third sub-pixels are not disposed in the second column of the first sub-area and the second column of the third sub-area.

In embodiments, a third column of the first sub-area may be adjacent to the first column of the first sub-area, and a fourth column of the first sub-area may be located between the first and third columns of the first sub-area. The second and first sub-pixels may be arranged in the third column of the first sub-area.

In embodiments, the first to third sub-pixels may not be disposed in the fourth column of the first sub-area.

In embodiments, the first to third sub-pixels may be arranged in a zigzag shape in an order of the first sub-pixel, the third sub-pixel, the second sub-pixel, and the third sub-pixel in the first and second columns of the display area.

In embodiments, a third column of the third sub-area may be adjacent to the first column of the third sub-area, and a fourth column of the third sub-area may be located between the first and third columns of the third sub-area. The third sub-pixels may be arranged in the third column of the third sub-area.

In embodiments, the first to third sub-pixels may not be disposed in the fourth column of the third sub-area.

In embodiments, the first to third sub-pixels may be arranged in a zigzag shape in an order of the second sub-pixel, the third sub-pixel, the first sub-pixel, and the third sub-pixel in the third and fourth columns of the display area.

In embodiments, the display device may further include a first circuit structure disposed in the second sub-area on the substrate.

In embodiments, the display device may further include a plurality of first, second, and third pixel circuits connected to the first to third sub-pixels disposed in the display area, the first display area, and the second display area, in which the first, second, and third pixel circuits are connected to the first to third sub-pixels, respectively. The first to third pixel circuits connected to the first to third sub-pixels disposed in the second sub-area, respectively, may be disposed in the first sub-area.

In embodiments, the display device may further include a second circuit structure disposed in the fourth sub-area on the substrate.

In embodiments, the display device may further include a plurality of first, second, and third pixel circuits connected to the first to third sub-pixels disposed in the display area, the first display area, and the second display area, in which the first, second, and third pixel circuits are connected to the first to third sub-pixels, respectively. The first to third pixel circuits connected to the first to third sub-pixels disposed in the fourth sub-area, respectively, may be disposed in the third sub-area.

In embodiments, a number of the first and second sub-pixels arranged in the first column of the display area may be equal to a number of the third sub-pixels arranged in the second column of the display area, and a number of the third sub-pixels arranged in the first column of the first sub-area may be smaller than the number of the first and second sub-pixels arranged in the first column of the display area.

In embodiments, the number of the third sub-pixels arranged in the first column of the first sub-area may be half the number of the first and second sub-pixels arranged in the first column of the display area.

In embodiments, the first display area and the second display area may be parallel to each other to face each other. The second and third columns of the display area may be located between the first and fourth columns of the display area, and the second column of the first sub-area may be located between the first column of the display area and the first column of the first sub-area. The second column of the third sub-area may be located between the fourth column of the display area and the first column of the third sub-area. Sizes of the first to third sub-pixels disposed in the first and second display areas may be greater than sizes of the first to third sub-pixels disposed in the display area, respectively.

According to embodiments of the inventive concepts, a display device includes a display area, a first display area located in one side of the display area and including a first sub-area and a second sub-area, and a second display area located in an opposite side of the display area and including a third sub-area and a fourth sub-area. The display device includes a substrate and a plurality of first, second, and third sub-pixels. The first, second, and third sub-pixels are disposed in the display area, the first display area, and the second display area on the substrate. The first and second sub-pixels may be repeatedly arranged in a first column of the display area that is adjacent to a first boundary between the display area and the first sub-area, and the third sub-pixels are arranged in a second column of the display area. The second and first sub-pixels may be repeatedly arranged in a third column of the display area that is adjacent to a second boundary between the display area and the third sub-area, and the third sub-pixels may be arranged in a fourth column of the display area. A first sub-pixel column including the third sub-pixels may be disposed in the first sub-area that is adjacent to the first boundary. A second sub-pixel column including the third sub-pixels may be disposed in the third sub-area that is adjacent to the second boundary. A distance where the first sub-pixel column is spaced apart from the second column of the display area may be equal to a distance where the second sub-pixel column is spaced apart from the fourth column of the display area.

In embodiments, the display device may further include a third sub-pixel column, a fourth sub-pixel column, and a fifth sub-pixel column. The third sub-pixel column may be spaced apart from the first sub-pixel column in a direction from the display area to the first display area in the first sub-area, and may include the second and first sub-pixels. The fourth sub-pixel column may be spaced apart from the third sub-pixel column in the direction in the first sub-area, and may include the third sub-pixels. The fifth sub-pixel column may be spaced apart from the fourth sub-pixel column in the direction in the first sub-area, and may include the first and second sub-pixels.

In embodiments, a separation distance between the first sub-pixel column and the third sub-pixel column in the direction may be smaller than a separation distance between the third sub-pixel column and the fourth sub-pixel column in the direction.

In embodiments, the display device may further include a sixth sub-pixel column, a seventh sub-pixel column, and an eighth sub-pixel column. The sixth sub-pixel column may be disposed between the fourth column of the display area and the second sub-pixel column in the third sub-area, and may include the first and second sub-pixels. The seventh sub-pixel column may be spaced apart from the second sub-pixel column in a direction from the display area to the third sub-area in the third sub-area, and may include the second and first sub-pixels. The eighth sub-pixel column may be spaced apart from the seventh sub-pixel column in the direction in the third sub-area, and may include the third sub-pixels.

In embodiments, a separation distance between the second sub-pixel column and the sixth sub-pixel column in the direction may be smaller than a separation distance between the second sub-pixel column and the seventh sub-pixel column in the direction.

According to embodiments of the inventive concepts, a display device includes a display area, a first display area located in one side of the display area and including a first sub-area and a second sub-area, and a second display area located in an opposite side of the display area and including a third sub-area and a fourth sub-area. The display device includes a substrate and a plurality of first, second, and third sub-pixels. The first, second, and third sub-pixels are disposed in the display area, the first display area, and the second display area on the substrate. The first and second sub-pixels may be repeatedly arranged in a first column of the display area that is adjacent to a first boundary between the display area and the first sub-area, and the third sub-pixels may be arranged in a second column of the display area. The third sub-pixels may be repeatedly arranged in a third column of the display area that is adjacent to a second boundary between the display area and the third sub-area, and the first and second sub-pixels may be repeatedly arranged in a fourth column of the display area. The third sub-pixels may be arranged in a first column of the first sub-area that is adjacent to the first boundary, and a second column of the first sub-area may be located between the first boundary and the first column of the first sub-area. The third sub-pixels may be arranged in a first column of the third sub-area that is adjacent to the second boundary, and a second column of the third sub-area may be located between the second boundary and the first column of the third sub-area. The first to third sub-pixels may not be disposed in the second column of the first sub-area and the second column of the third sub-area.

According to the display device of the embodiments of the inventive concepts, the first to third sub-pixels are not disposed in the second column of the first sub-area and the second column of the third sub-area, so that a defect may not occur in the process of forming the light emitting layer of each of the first to third sub-pixels that are adjacent to the first and second boundaries.

According the display device of the embodiments of the inventive concepts, the distance g1 of the first sub-pixel column from the second column of the display area is substantially equal to the distance of the second sub-pixel column from the fourth column of the display area, so that a value of the roughness index (R-index) may be relatively reduced, and image quality of the display device may be relatively improved.

According to the display device of the embodiments of the inventive concepts, when the arrangements of the sub-pixels in the first column and the last column in the display area are the same, and the arrangement of the sub-pixels disposed in the first display area and the arrangement of the sub-pixels disposed in the second display area are symmetrical with each other, the value of the R-index may be relatively reduced, and image quality of the display device may be relatively improved. In addition, a defect may not occur in the process of forming the light emitting layer of each of the first to third sub-pixels that are adjacent to the first and second boundaries.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

Embodiments can be understood in more detail from the following description taken in conjunction with the accompanying drawings.

DETAILED DESCRIPTION

Figure 1:
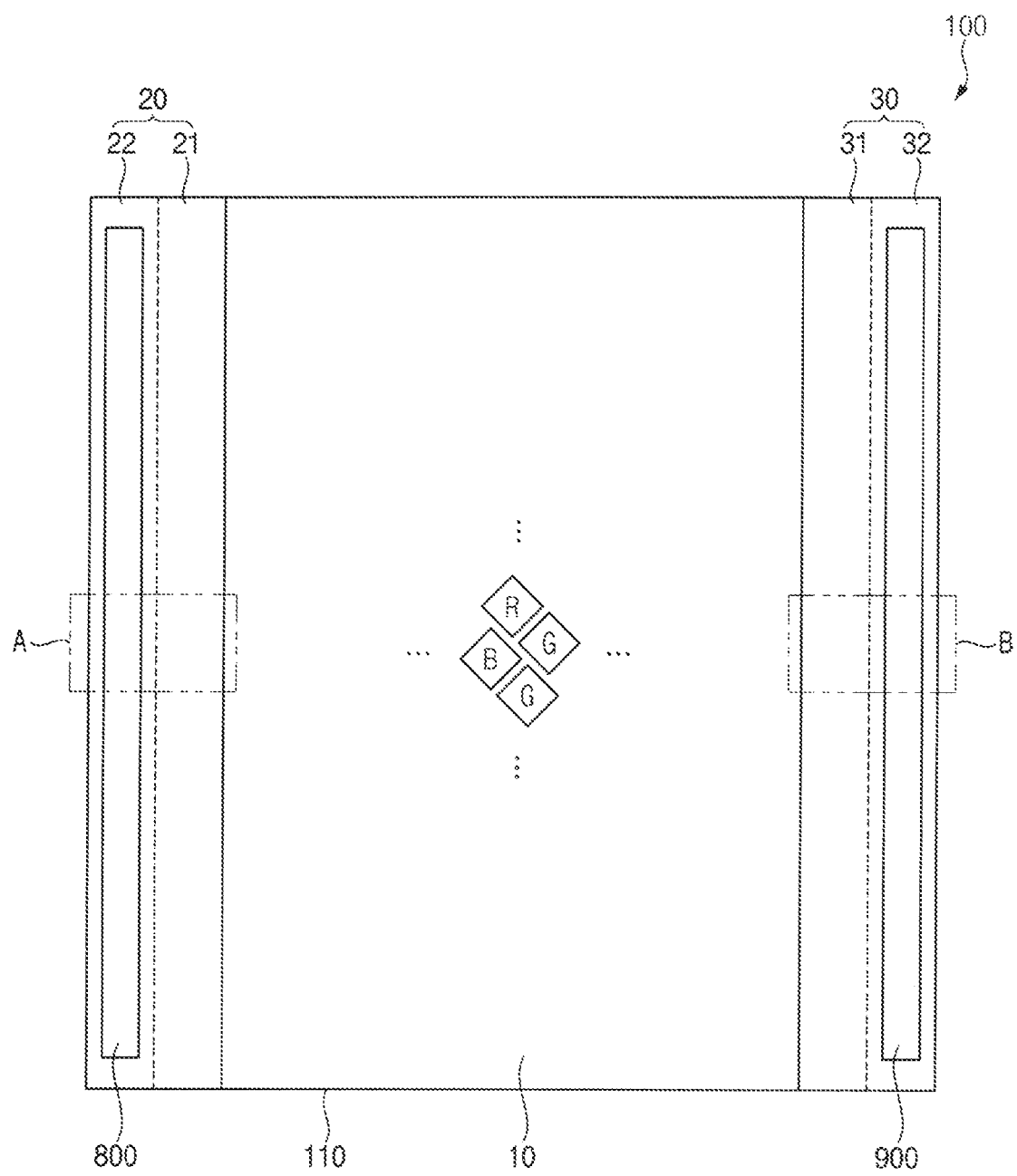
FIG. 1 is a plan view showing a display device according to embodiments that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the illustrative term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, display devices according to one or more embodiments will be described in detail with reference to the accompanying drawings. In the accompanying drawings, same or similar reference numerals refer to the same or similar elements.

FIG. 1 is a plan view showing a display device according to embodiments that is constructed according to principles of the invention.

Referring to FIG. 1, a display device 100 may include a substrate 110, first to third sub-pixels R, B, and G (e.g., a red sub-pixel R, a blue sub-pixel B, and a green sub-pixel G), a first circuit structure 800, a second circuit structure 900, and the like. In addition, the display device 100 may include a display area 10, a first display area 20, and a second display area 30. In this case, the first display area 20 may include a first sub-area 21 and a second sub-area 22, and the second display area 30 may include a third sub-area 31 and a fourth sub-area 32. In alternative implementations from what is shown in FIG. 1, the display device 100 may further include first to third pixel circuits connected to the first to third sub-pixels R, B, and G, respectively.

The first display area 20 may be located in one side of the display area 10, and the second display area 30 may be located in an opposite side of the display area 10. In other words, the display area 10 may be located between the first display area 20 and the second display area 30. The first display area 20 and the second display area 30 may face each other, and may be substantially parallel to each other. In addition, the first sub-area 21 may be located closer to the display area 10 than the second sub-area 22, and the third sub-area 31 may be located closer to the display area 10 than the fourth sub-area 32.

The first to third sub-pixels R, B, and G may be disposed in the display area 10, the first display area 20, and the second display area 30 on the substrate 110. The first to third sub-pixels R, B, and G may be arranged such that red/green-blue/green (RG-BG) sub-pixels are repeatedly arranged in a first direction D1 (e.g., a row direction) that is parallel to a top surface of the display device 100 (e.g., in a PenTile™ scheme).

Figure 4:
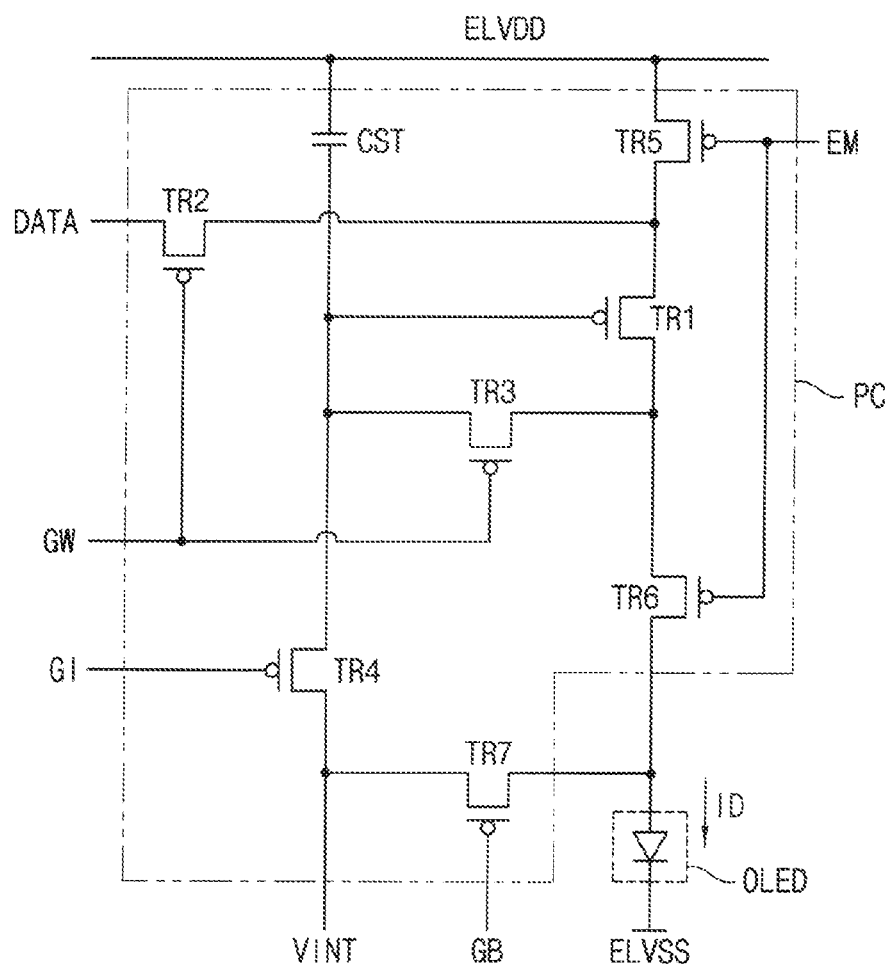
FIG. 4 is a circuit diagram showing a sub-pixel and a pixel circuit included in the display device of FIG. 1.

For example, each of the first to third sub-pixels R, B, and G may correspond to an organic light emitting diode OLED shown in FIG. 4, and the first to third pixel circuits may correspond to a pixel circuit PC shown in FIG. 4. An image may be displayed in the display area 10, the first display area 20, and the second display area 30 through the first to third sub-pixels R, B, and G and the first to third pixel circuits.

In the display area 10, the first sub-pixel R may overlap the first pixel circuit connected to the first sub-pixel R, the second sub-pixel B may overlap the second pixel circuit connected to the second sub-pixel B, and the third sub-pixel G may overlap the third pixel circuit connected to the third sub-pixel G.

In the first sub-area 21 and the third sub-area 31, the first sub-pixel R may overlap the first pixel circuit connected to the first sub-pixel R, the second sub-pixel B may overlap the second pixel circuit connected to the second sub-pixel B, and the third sub-pixel G may overlap the third pixel circuit connected to the third sub-pixel G.

In the second sub-area 22 and the fourth sub-area 32, the first sub-pixel R may not overlap the first pixel circuit connected to the first sub-pixel R, the second sub-pixel B may not overlap the second pixel circuit connected to the second sub-pixel B, and the third sub-pixel G may not overlap the third pixel circuit connected to the third sub-pixel G. For example, since the first and second circuit structures 800 and 900 are disposed in the second sub-area 22 and the fourth sub-area 32, respectively, a space for arranging the first to third pixel circuits connected to the first to third sub-pixels R, B, and G may be insufficient. Therefore, the first to third pixel circuits connected to the first to third sub-pixels R, B, and G disposed in the second sub-area 22 may be disposed in the first sub-area 21, and the first to third pixel circuits connected to the first to third sub-pixels R, B, and G disposed in the fourth sub-area 32 may be disposed in the third sub-area 31 (see FIG. 5).

Each of the first to third pixel circuits may be provided with at least one driving transistor, at least one switching transistor, at least one capacitor, and the like. In embodiments, each of the first to third pixel circuits may be provided with one driving transistor (e.g., a first transistor TR1 of FIG. 4), six switching transistors (e.g., second to seventh transistors TR2, TR3, TR4, TR5, TR6, and TR7 of FIG. 4), one storage capacitor (e.g., a storage capacitor CST of FIG. 4), and the like.

In the embodiments, sizes of the first to third sub-pixels R, B, and G disposed in the display area 10 may be different from sizes of the first to third sub-pixels R, B, and G disposed in the first and second display areas 20 and 30, respectively. For example, the sizes of the first to third sub-pixels R, B, and G disposed in the first and second display areas 20 and 30 may be greater than the sizes of the first to third sub-pixels R, B, and G disposed in the display area 10, respectively. In this case, configurations (e.g., a number of transistors and a number of capacitors) of the first to third pixel circuits disposed in the display area 10 may be different from configurations of the first to third pixel circuits disposed in the first and second display areas 20 and 30, respectively.

In addition, the display device 100 may further include a pad area located on a lower side of the display area 10. Pad electrodes may be disposed in the pad area. An external device configured to provide a signal and a power to the display device 100 may be electrically connected to the pad electrode through a flexible printed circuit board or a printed circuit board. The external device may generate a data signal, a gate signal, an emission control signal, a gate initialization signal, an initialization voltage, a power supply voltage, and the like, and the data signal, the gate signal, the emission control signal, the gate initialization signal, the initialization voltage, the power supply voltage, and the like may be provided to the first circuit structure 800, the second circuit structure 900, the first to third pixel circuits, and the first to third sub-pixels R, B, and G through the pad electrodes and the flexible printed circuit board. In addition, a driver integrated circuit may be mounted on the flexible printed circuit board. In other embodiments, the driver integrated circuit may be mounted on the display device 100 adjacent to the pad electrodes.

The first circuit structure 800 may be disposed in the second sub-area 22 on the substrate 110, and the second circuit structure 900 may be disposed in the fourth sub-area 32 on the substrate 110. The first circuit structure 800 and the second circuit structure 900 may include a gate driver, an emission signal driver, and the like.

The gate driver may receive the gate signal from the external device, and the gate signal may be provided to the first to third pixel circuits through the gate driver. The emission signal driver may receive the emission control signal from the external device, and the emission control signal may be provided to the first to third pixel circuits through the emission signal driver.

In the embodiments, although the first circuit structure 800 and the second circuit structure 900 are disposed in the second sub-area 22 and the fourth sub-area 32, respectively, the display device 100 includes the first to third sub-pixels R, B, and G disposed in all of the display area 10, the first display area 20, and the second display area 30, so that an image may be displayed over the whole top surface of the display device 100. In other embodiments, the first display area 20 may not exist, and the first circuit structure 800 disposed in the second sub-area 22 may be disposed in the fourth sub-area 32 together with the second circuit structure 900.

However, although each of the display area 10, the first display area 20, and the second display area 30 according to one or more embodiments has been described as having a rectangular shape when viewed in a plan view, the shape is not limited thereto. For example, each of the display area 10, the first display area 20, and the second display area 30 may have a triangular shape, a rhombic shape, a polygonal shape, a circular shape, a track shape, or an elliptical shape when viewed in a plan view.

Figure 2:
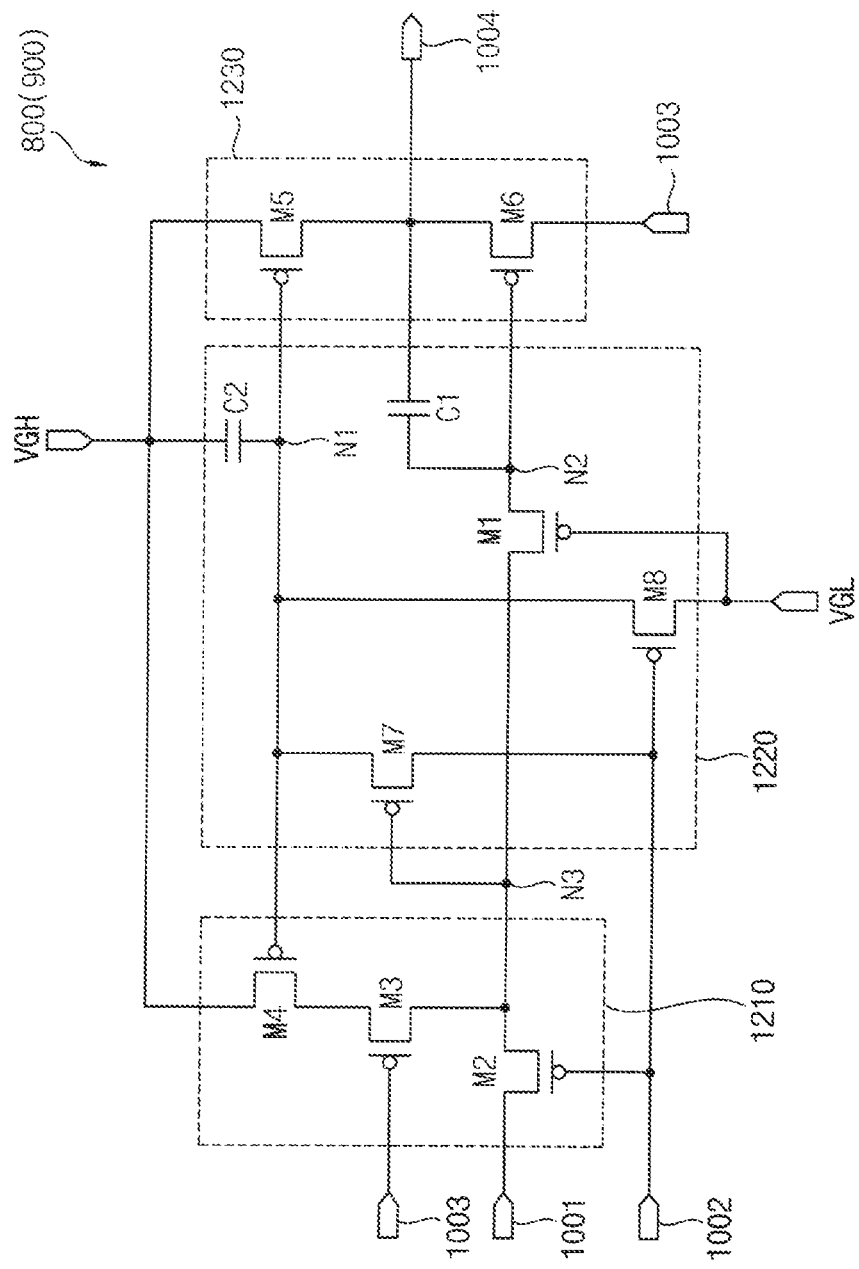
FIG. 2 is a circuit diagram showing one example of a circuit structure included in the display device of FIG. 1.

FIG. 2 is a circuit diagram showing one example of a circuit structure included in the display device of FIG. 1. The circuit structure shown in FIG. 2 may correspond to one gate stage included in the gate driver.

Referring to FIG. 2, the first circuit structure 800 (or the second circuit structure 900) may include a first driving unit 1210, a second driving unit 1220, an output unit 1230, and a first transistor M1.

The output unit 1230 may include a fifth transistor M5 and a sixth transistor M6. The output unit 1230 may control a voltage supplied to an output terminal 1004 based on voltages of a first node N1 and a second node N2. The fifth transistor M5 may be connected between a first driving power (VGH) wire (e.g., a high power supply voltage wire) and the output terminal 1004, and a gate electrode of the fifth transistor M5 may be connected to the first node N1. The fifth transistor M5 may control a connection between the first driving power (VGH) wire and the output terminal 1004 based on the voltage applied to the first node N1. The sixth transistor M6 may be connected between the output terminal 1004 and a third input terminal 1003, and a gate electrode of the sixth transistor M6 may be connected to the second node N2. The sixth transistor M6 may control a connection between the output terminal 1004 and the third input terminal 1003 based on the voltage applied to the second node N2. The output unit 1230 may be driven by a buffer. In some embodiments, the fifth transistor M5 and/or the sixth transistor M6 may have a configuration in which a plurality of transistors are connected in parallel with each other.

The first driving unit 1210 may include a second transistor M2, a third transistor M3, and a fourth transistor M4. The first driving unit 1210 may control a voltage of a third node N3 based on clock signals supplied to a first input terminal 1001, a second input terminal 1002, and a third input terminal 1003. The second transistor M2 may be connected between the first input terminal 1001 and the third node N3, and a gate electrode of the second transistor M2 may be connected to the second input terminal 1002. The second transistor M2 may control a connection between the first input terminal 1001 and the third node N3 based on the clock signal supplied to the second input terminal 1002. The third transistor M3 and the fourth transistor M4 may be connected in series between the third node N3 and the first driving power (VGH) wire. The third transistor M3 may be connected between the fourth transistor M4 and the third node N3, and a gate electrode of the third transistor M3 may be connected to the third input terminal 1003. The third transistor M3 may control a connection between the fourth transistor M4 and the third node N3 based on the clock signal supplied to the third input terminal 1003. The fourth transistor M4 may be connected between the third transistor M3 and the first driving power (VGH) wire, and a gate electrode of the fourth transistor M4 may be connected to the first node N1. The fourth transistor M4 may control a connection between the third transistor M3 and the first driving power (VGH) wire based on the voltage of the first node N1.

The second driving unit 1220 may include a seventh transistor M7, an eighth transistor M8, a first capacitor C1, and a second capacitor C2. The second driving unit 1220 may control the voltage of the first node N1 based on the second input terminal 1002 and the voltage of the third node N3. The first capacitor C1 may be connected between the second node N2 and the output terminal 1004. The first capacitor C1 may charge a voltage based on turn-on and turn-off of the sixth transistor M6. The second capacitor C2 may be connected between the first node N1 and the first driving power (VGH) wire. The second capacitor C2 may charge the voltage applied to the first node N1. The seventh transistor M7 may be connected between the first node N1 and the second input terminal 1002, and a gate electrode of the seventh transistor M7 may be connected to the third node N3. The seventh transistor M7 may control a connection between the first node N1 and the second input terminal 1002 based on the voltage of the third node N3. The eighth transistor M8 may be connected between the first node N1 and a second driving power (VGL) wire (e.g., a low power supply voltage wire), and a gate electrode of the eighth transistor M8 may be connected to the second input terminal 1002. The eighth transistor M8 may control a connection between the first node N1 and the second driving power (VGL) wire based on the clock signal of the second input terminal 1002. The first transistor M1 may be connected between the third node N3 and the second node N2, and a gate electrode of the first transistor M1 may be connected to the second driving power (VGL) wire. The first transistor M1 may maintain an electrical connection between the third node N3 and the second node N2 while maintaining a turn-on state. In some embodiments, the first transistor M1 may limit a voltage drop level of the third node N3 based on the voltage of the second node N2. In other words, even when the voltage of the second node N2 drops to a voltage that is lower than a voltage of a second driving power VGL, the voltage of the third node N3 may not become lower than the voltage obtained by subtracting a threshold voltage of the first transistor M1 from the second driving power VGL.

Accordingly, the first circuit structure 800 may output the gate signal (e.g., a gate signal GW of FIG. 4) to the output terminal 1004.

However, although the first circuit structure 800 has been described as including eight transistors and two capacitors, the configuration of the embodiment described herein is not limited thereto. For example, the first circuit structure 800 may have a configuration including at least one transistor and at least one capacitor.

Figure 3:
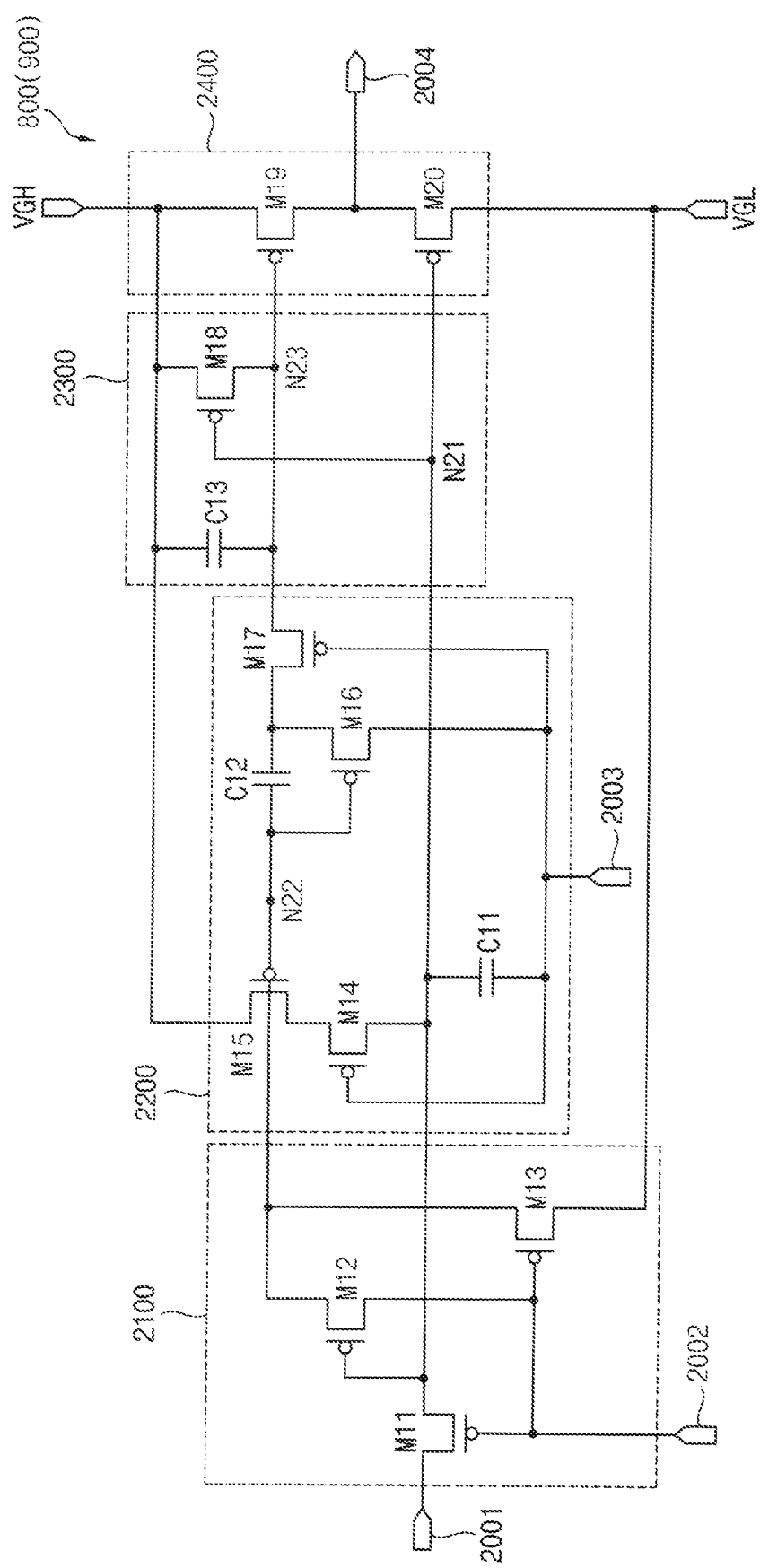
FIG. 3 is a circuit diagram showing another example of the circuit structure included in the display device of FIG. 1.

FIG. 3 is a circuit diagram showing another example of the circuit structure included in the display device of FIG. 1. The circuit structure shown in FIG. 3 may correspond to one emission signal stage included in the emission signal driver.

Referring to FIG. 3, the first circuit structure 800 (or the second circuit structure 900) may include a first signal processing unit 2100, a second signal processing unit 2200, a third signal processing unit 2300, and an output unit 2400.

The first signal processing unit 2100 may include an eleventh transistor M11, a twelfth transistor M12, and a thirteenth transistor M13. The first signal processing unit 2100 may control voltages of a twenty-second node N22 and a twenty-first node N21 based on signals supplied to a first input terminal 2001 and a second input terminal 2002. The eleventh transistor M11 may be connected between the first input terminal 2001 and the twenty-first node N21, and a gate electrode of the eleventh transistor M11 may be connected to the second input terminal 2002. The eleventh transistor M11 may be turned on when a clock signal is supplied to the second input terminal 2002. The twelfth transistor M12 may be connected between the second input terminal 2002 and the twenty-second node N22, and a gate electrode of the twelfth transistor M12 may be connected to the twenty-first node N21. The twelfth transistor M12 may be turned on or turned off based on the voltage of the twenty-first node N21. The thirteenth transistor M13 may be connected between a second driving power (VGL) wire and the twenty-second node N22, and a gate electrode of the thirteenth transistor M13 may be connected to the second input terminal 2002. The thirteenth transistor M13 may be turned on when the clock signal is supplied to the second input terminal 2002.

The second signal processing unit 2200 may include a fourteenth transistor M14, a fifteenth transistor M15, a sixteenth transistor M16, a seventeenth transistor M17, an eleventh capacitor C11, and a twelfth capacitor C12. The second signal processing unit 2200 may control voltages of the twenty-first node N21 and a twenty-third node N23 based on a clock signal supplied to a third input terminal 2003 and the voltage of the twenty-second node N22. The fourteenth transistor M14 may be connected between the fifteenth transistor M15 and the twenty-first node N21, and a gate electrode of the fourteenth transistor M14 may be connected to the third input terminal 2003. The fourteenth transistor M14 may be turned on when a clock signal is supplied to the third input terminal 2003. The fifteenth transistor M15 may be connected between a first driving power (VGH) wire and the fourteenth transistor M14, and a gate electrode of the fifteenth transistor M15 may be connected to the twenty-second node N22. The fifteenth transistor M15 may be turned on or turned off based on the voltage of the twenty-second node N22. The sixteenth transistor M16 may be connected between a first electrode of the seventeenth transistor M17 and the third input terminal 2003, and a gate electrode of the sixteenth transistor M16 may be connected to the twenty-second node N22. The sixteenth transistor M16 may be turned on or turned off based on the voltage of the twenty-second node N22. The seventeenth transistor M17 may be connected between a first electrode of the sixteenth transistor M16 and the twenty-third node N23, and a gate electrode of the seventeenth transistor M17 may be connected to the third input terminal 2003. The seventeenth transistor M17 may be turned on when the clock signal is supplied to the third input terminal 2003. The eleventh capacitor C11 may be connected between the twenty-first node N21 and the third input terminal 2003. The twelfth capacitor C12 may be connected between the twenty-second node N22 and the first electrode of the seventeenth transistor M17.

The third signal processing unit 2300 may include an eighteenth transistor M18 and a thirteenth capacitor C13. The third signal processing unit 2300 may control the voltage of the twenty-third node N23 based on the voltage of the twenty-first node N21. The eighteenth transistor M18 may be connected between the first driving power (VGH) wire and the twenty-third node N23, and a gate electrode of the eighteenth transistor M18 may be connected to the twenty-first node N21. The eighteenth transistor M18 may be turned on or turned off based on the voltage of the twenty-first node N21. The thirteenth capacitor C13 may be connected between the first driving power (VGH) wire and the twenty-third node N23.

The output unit 2400 may include a nineteenth transistor M19 and a twentieth transistor M20. The output unit 2400 may control a voltage supplied to an output terminal 2004 based on the voltages of the twenty-first node N21 and the twenty-third node N23. The nineteenth transistor M19 may be connected between the first driving power (VGH) wire and the output terminal 2004, and a gate electrode of the nineteenth transistor M19 may be connected to the twenty-third node N23. The nineteenth transistor M19 may be turned on or turned off based on the voltage of the twenty-third node N23. The twentieth transistor M20 may be connected between the output terminal 2004 and the second driving power (VGL) wire, and a gate electrode of the twentieth transistor M20 may be connected to the twenty-first node N21. The twentieth transistor M20 may be turned on or turned off based on the voltage of the twenty-first node N21. The output unit 2400 may be driven by a buffer. In some embodiments, the nineteenth transistor M19 and/or the twentieth transistor M20 may have a configuration in which a plurality of transistors are connected in parallel with each other.

Accordingly, the second circuit structure 900 may output the emission control signal (e.g., an emission control signal EM of FIG. 4) to the output terminal 2004.

However, although the second circuit structure 900 has been described as including ten transistors and three capacitors, the configuration of the embodiment described herein is not limited thereto. For example, the second circuit structure 900 may have a configuration including at least one transistor and at least one capacitor.

In the embodiments, the display device 100 may have a configuration in which the circuit structure of FIG. 2 and the circuit structure of FIG. 3 are disposed in the second sub-area 22 and the fourth sub-area 32, respectively, or a configuration in which the circuit structure of FIG. 2 or the circuit structure of FIG. 3 is disposed in each of the second sub-area 22 and the fourth sub-area 32.

FIG. 4 is a circuit diagram showing a sub-pixel and a pixel circuit included in the display device of FIG. 1.

Referring to FIG. 4, each of the first to third sub-pixels R, B, and G included in the display device 100 may correspond to the organic light emitting diode OLED, and each of the first to third pixel circuits included in the display device 100 may correspond to the pixel circuit PC. When viewed in a sectional view of the display device 100, the pixel circuit PC may be disposed on the substrate 110, and the organic light emitting diode OLED may be disposed on the pixel circuit PC.

The pixel circuit PC may include first to seventh transistors TR1, TR2, TR3, TR4, TR5, TR6, and TR7, and a storage capacitor CST. The first transistor TR1 may correspond to a driving transistor, and the second to seventh transistors TR2, TR3, TR4, TR5, TR6, and TR7 may correspond to switching transistors. Each of the first to seventh transistors TR1, TR2, TR3, TR4, TR5, TR6, and TR7 may include a first terminal, a second terminal, a channel, and a gate terminal. In the embodiments, the first terminal may be a source terminal, and the second terminal may be a drain terminal. In some embodiments, the first terminal may be a drain terminal, and the second terminal may be a source terminal.

The organic light emitting diode OLED may output light based on a driving current ID. The organic light emitting diode OLED may include a first terminal and a second terminal. In the embodiments, the second terminal of the organic light emitting diode OLED may receive a low power supply voltage ELVSS, and the first terminal of the organic light emitting diode OLED may receive a high power supply voltage ELVDD. For example, the first terminal of the organic light emitting diode OLED may be an anode terminal, and the second terminal of the organic light emitting diode OLED may be a cathode terminal. In some embodiments, the first terminal of the organic light emitting diode OLED may be a cathode terminal, and the second terminal of the organic light emitting diode OLED may be an anode terminal.

The first transistor TR1 may generate the driving current ID. In the embodiments, the first transistor TR1 may operate in a saturation region. In this case, the first transistor TR1 may generate the driving current ID based on a voltage difference between the gate terminal and the source terminal of the first transistor TR1. In addition, gray levels may be expressed based on a magnitude of the driving current ID supplied to the organic light emitting diode OLED. In some embodiments, the first transistor TR1 may operate in a linear region. In this case, the gray levels may be expressed based on a total time during which the driving current is supplied to the organic light emitting diode OLED within one frame.

The gate terminal of the second transistor TR2 may receive the gate signal GW. For example, the gate signal GW may be provided from the gate stage shown in FIG. 2, and the gate signal GW may be applied to the gate terminal of the second transistor TR2 through a gate signal (GW) wire. The first terminal of the second transistor TR2 may receive a data signal DATA. The second terminal of the second transistor TR2 may be connected to the first terminal of the first transistor TR1. For example, the gate signal GW may be provided from the gate stage shown in FIG. 2, and the gate signal GW may be applied to the gate terminal of the second transistor TR2 through the gate signal (GW) wire. The second transistor TR2 may supply the data signal DATA to the first terminal of the first transistor TR1 during an activation period of the gate signal GW. In this case, the second transistor TR2 may operate in a linear region.

The gate terminal of the third transistor TR3 may receive the gate signal GW. For example, the gate signal GW may be provided from the gate stage shown in FIG. 2, and the gate signal GW may be applied to the gate terminal of the third transistor TR3 through the gate signal (GW) wire. The first terminal of the third transistor TR3 may be connected to the gate terminal of the first transistor TR1. The second terminal of the third transistor TR3 may be connected to the second terminal of the first transistor TR1. The third transistor TR3 may connect the gate terminal of the first transistor TR1 to the second terminal of the first transistor TR1 during the activation period of the gate signal GW. In this case, the third transistor TR3 may operate in a linear region. In other words, the third transistor TR3 may diode-connect the first transistor TR1 during the activation period of the gate signal GW.

An input terminal of an initialization voltage wire to which an initialization voltage VINT is provided may be connected to the first terminal of the fourth transistor TR4 and the first terminal of the seventh transistor TR7, and an output terminal of the initialization voltage wire may be connected to the second terminal of the fourth transistor TR4 and a first terminal of the storage capacitor CST.

The gate terminal of the fourth transistor TR4 may receive a gate initialization signal GI. The first terminal of the fourth transistor TR4 may receive the initialization voltage VINT. The second terminal of the fourth transistor TR4 may be connected to the gate terminal of the first transistor TR1.

The fourth transistor TR4 may supply the initialization voltage VINT to the gate terminal of the first transistor TR1 during an activation period of the gate initialization signal GI. In this case, the fourth transistor TR4 may operate in a linear region. In other words, the fourth transistor TR4 may initialize the gate terminal of the first transistor TR1 to the initialization voltage VINT during the activation period of the gate initialization signal GI. In the embodiments, the initialization voltage VINT may have a voltage level that is sufficiently lower than a voltage level of the data signal DATA maintained by the storage capacitor CST in a previous frame, and the initialization voltage VINT may be supplied to the gate terminal of the first transistor TR1. In other embodiments, the initialization voltage may have a voltage level that is sufficiently higher than the voltage level of the data signal maintained by the storage capacitor in the previous frame, and the initialization voltage may be applied to the gate terminal of the first transistor TR1.

The gate terminal of the fifth transistor TR5 may receive the emission control signal EM. For example, the emission control signal EM may be provided from the emission signal stage shown in FIG. 3, and the emission control signal EM may be applied to the gate terminal of the fifth transistor TR5 through an emission control signal (EM) wire. The first terminal of the fifth transistor TR5 may be connected to a high power supply voltage (ELVDD) wire. The second terminal of the fifth transistor TR5 may be connected to the first terminal of the first transistor TR1. The fifth transistor TR5 may supply the high power supply voltage ELVDD to the first terminal of the first transistor TR1 during an activation period of the emission control signal EM. On the contrary, the fifth transistor TR5 may cut off the supply of the high power supply voltage ELVDD during an inactivation period of the emission control signal EM. In this case, the fifth transistor TR5 may operate in a linear region. Since the fifth transistor TR5 supplies the high power supply voltage ELVDD to the first terminal of the first transistor TR1 during the activation period of the emission control signal EM, the first transistor TR1 may generate the driving current ID. In addition, since the fifth transistor TR5 cuts off the supply of the high power supply voltage ELVDD during the inactivation period of the emission control signal EM, the data signal DATA supplied to the first terminal of the first transistor TR1 may be supplied to the gate terminal of the first transistor TR1.

The gate terminal of the sixth transistor TR6 may receive the emission control signal EM. For example, the emission control signal EM may be provided from the emission signal stage shown in FIG. 3, and the emission control signal EM may be applied to the gate terminal of the sixth transistor TR6 through the emission control signal (EM) wire. The first terminal of the sixth transistor TR6 may be connected to the second terminal of the first transistor TR1. The second terminal of the sixth transistor TR6 may be connected to the first terminal of the organic light emitting diode OLED. The sixth transistor TR6 may supply the driving current ID generated by the first transistor TR1 to the organic light emitting diode OLED during the activation period of the emission control signal EM. In this case, the sixth transistor TR6 may operate in a linear region. In other words, since the sixth transistor TR6 supplies the driving current ID generated by the first transistor TR1 to the organic light emitting diode OLED during the activation period of the emission control signal EM, the organic light emitting diode OLED may output light. In addition, since the sixth transistor TR6 electrically separates the first transistor TR1 and the organic light emitting diode OLED from each other during the inactivation period of the emission control signal EM, the data signal DATA supplied to the second terminal of the first transistor TR1 (to be more precise, a data signal for which the threshold voltage is compensated) may be supplied to the gate terminal of the first transistor TR1.

The gate terminal of the seventh transistor TR7 may receive a diode initialization signal GB. The first terminal of the seventh transistor TR7 may receive the initialization voltage VINT. The second terminal of the seventh transistor TR7 may be connected to the first terminal of the organic light emitting diode OLED. The seventh transistor TR7 may supply the initialization voltage VINT to the first terminal of the organic light emitting diode OLED during an activation period of the diode initialization signal GB. In this case, the seventh transistor TR7 may operate in a linear region. In other words, the seventh transistor TR7 may initialize the first terminal of the organic light emitting diode OLED to the initialization voltage VINT during the activation period of the diode initialization signal GB.

The storage capacitor CST may include a first terminal and a second terminal. The storage capacitor CST may be connected between the high power supply voltage (ELVDD) wire and the gate terminal of the first transistor TR1. For example, the first terminal of the storage capacitor CST may be connected to the gate terminal of the first transistor TR1, and the second terminal of the storage capacitor CST may be connected to the high power supply voltage (ELVDD) wire. The storage capacitor CST may maintain a voltage level of the gate terminal of the first transistor TR1 during an inactivation period of the gate signal GW. The inactivation period of the gate signal GW may include the activation period of the emission control signal EM, and the driving current ID generated by the first transistor TR1 may be supplied to the organic light emitting diode OLED during the activation period of the emission control signal EM. Therefore, the driving current ID generated by the first transistor TR1 may be supplied to the organic light emitting diode OLED based on the voltage level maintained by the storage capacitor CST.

However, although the pixel circuit PC according to the embodiment described herein has been described as including seven transistors and one storage capacitor, the configuration of the embodiment described herein is not limited thereto. For example, the pixel circuit PC may have a configuration including at least one transistor and at least one storage capacitor.

Figure 5:
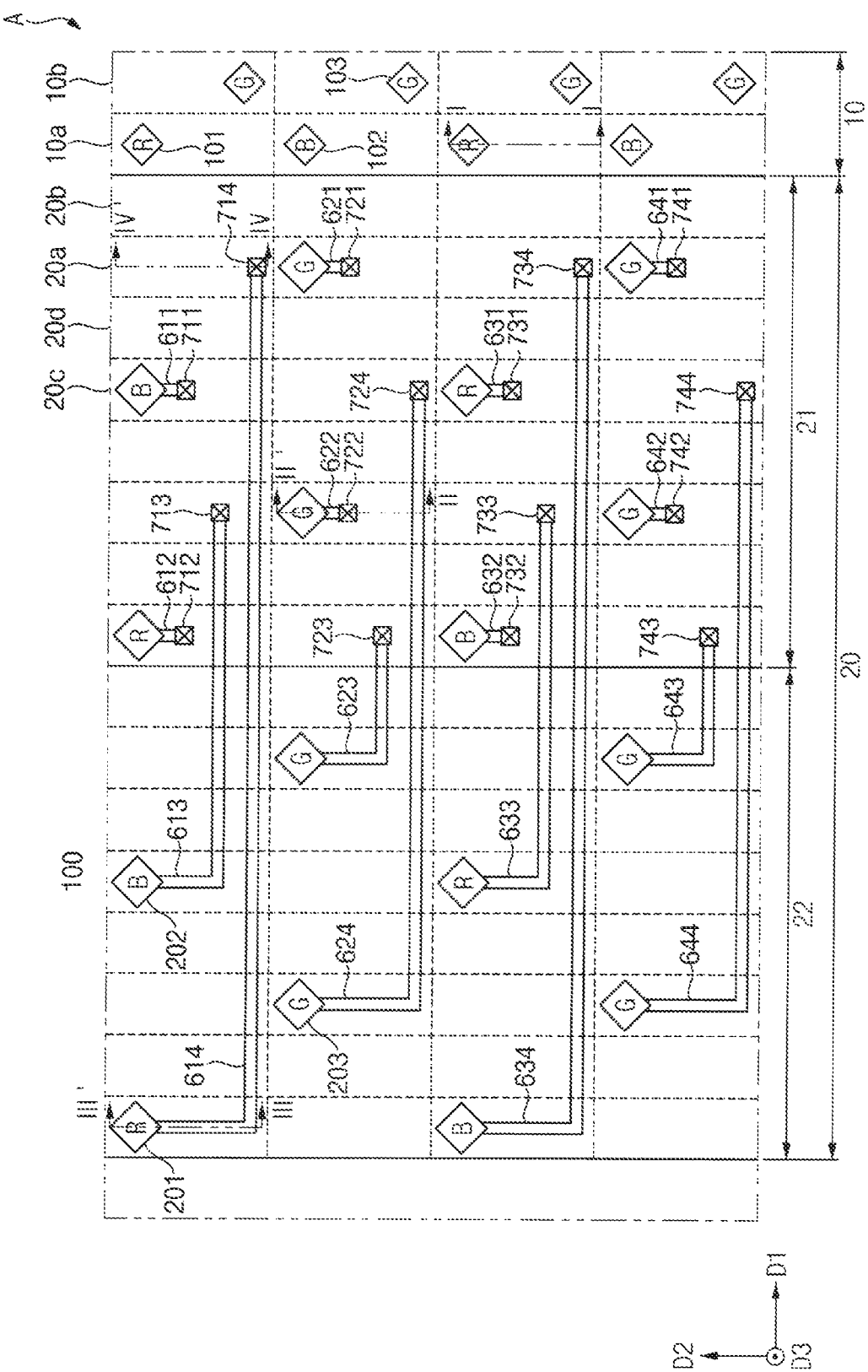
FIG. 5 is a partially enlarged plan view showing a region A of FIG. 1.
Figure 6:
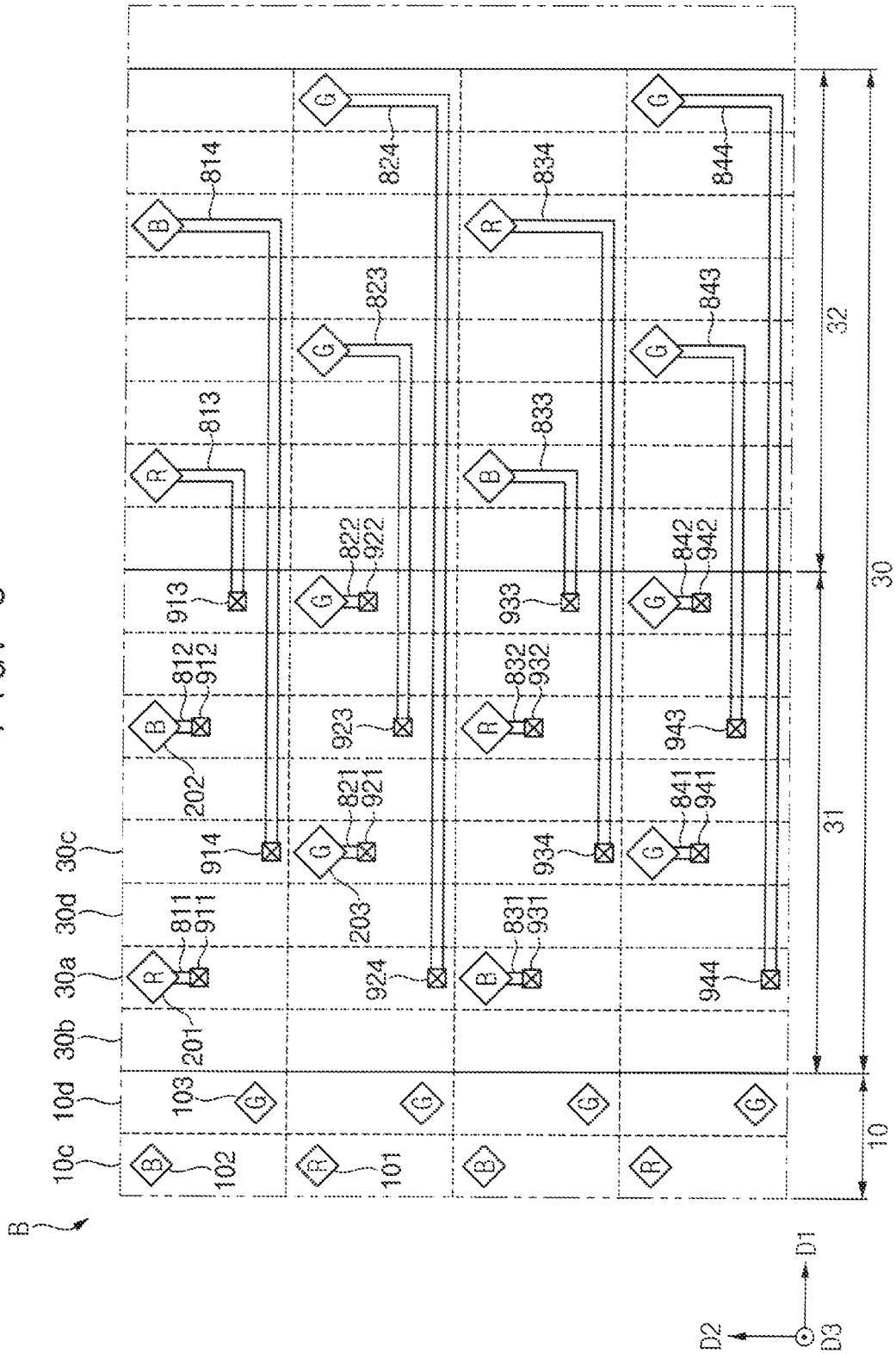
FIG. 6 is a partially enlarged plan view showing a region B of FIG. 1.

FIG. 5 is a partially enlarged plan view showing a region A of FIG. 1, and FIG. 6 is a partially enlarged plan view showing a region B of FIG. 1. For convenience of description, the first to third sub-pixels R, B, and G disposed in the display area 10 will be defined as a first sub-pixel 101, a second sub-pixel 102, and a third sub-pixel 103, respectively, and the first to third sub-pixels R, B, and G disposed in the first display area 20 and the second display area 30 will be defined as a first sub-pixel 201, a second sub-pixel 202, and a third sub-pixel 203, respectively.

Referring to FIGS. 5 and 6, the first to third sub-pixels 101, 102, and 103 may be arranged over the whole substrate 110. As described above, the first to third sub-pixels 101, 102, and 103 may be arranged in a PenTile™ scheme.

The first and second sub-pixels 101 and 102 may be repeatedly arranged in a first column 10a of the display area 10 that is adjacent to a first boundary between the display area 10 and the first sub-area 21 (e.g., corresponding to a second direction D2 orthogonal to the first direction D1). For example, the first sub-pixel 101 may be disposed at an upper end in a first row and the first column 10a of the display area 10, the second sub-pixel 102 may be disposed at an upper end in a second row and the first column 10a of the display area 10, the first sub-pixel 101 may be disposed at an upper end in a third row and the first column 10*a* of the display area 10, and the second sub-pixel 102 may be disposed at an upper end in a fourth row and the first column 10*a* of the display area 10.

In addition, the third sub-pixels 103 may be repeatedly arranged in a second column 10*b* of the display area 10. For example, the third sub-pixel 103 may be disposed at a lower end in the first row and the second column 10*b* of the display area 10, the third sub-pixel 103 may be disposed at a lower end in the second row and the second column 10*b* of the display area 10, the third sub-pixel 103 may be disposed at a lower end in the third row and the second column 10*b* of the display area 10, and the third sub-pixel 103 may be disposed at a lower end in the fourth row and the second column 10*b* of the display area 10. For example, the first column 10*a* may be located between the second column 10*b* and the first boundary.

Similarly, the second and first sub-pixels 102 and 101 may be repeatedly arranged in a third column 10*c* of the display area 10 that is adjacent to a second boundary between the display area 10 and the third sub-area 31. For example, the second sub-pixel 102 may be disposed at an upper end in the first row and the third column 10*c* of the display area 10, the first sub-pixel 101 may be disposed at an upper end in the second row and the third column 10*c* of the display area 10, the second sub-pixel 102 may be disposed at an upper end in the third row and the third column 10*c* of the display area 10, and the first sub-pixel 101 may be disposed at an upper end in the fourth row and the third column 10*c* of the display area 10.

In addition, the third sub-pixels 103 may be repeatedly arranged in a fourth column 10*d* of the display area 10. For example, the third sub-pixel 103 may be disposed at a lower end in the first row and the fourth column 10*d* of the display area 10, the third sub-pixel 103 may be disposed at a lower end in the second row and the fourth column 10*d* of the display area 10, the third sub-pixel 103 may be disposed at a lower end in the third row and the fourth column 10*d* of the display area 10, and the third sub-pixel 103 may be disposed at a lower end in the fourth row and the fourth column 10*d* of the display area 10. For example, the fourth column 10*d* may be located between the third column 10*c* and the second boundary.

In this way, the first to third sub-pixels 101, 102, and 103 may be arranged over the whole display area 10 in the PenTile™ scheme. In other words, the first to third sub-pixels 101, 102, and 103 may be arranged in a zigzag shape in an order of the first sub-pixel 101, the third sub-pixel 103, the second sub-pixel 102, and the third sub-pixel 103 in the first and second columns 10*a* and 10*b* of the display area 10. In addition, the first to third sub-pixels 101, 102, and 103 may be arranged in a zigzag shape in an order of the second sub-pixel 102, the third sub-pixel 103, the first sub-pixel 101, and the third sub-pixel 103 in the third and fourth columns 10*c* and 10*d* of the display area 10.

The first to third sub-pixels 201, 202, and 203 may be arranged over the whole of the first display area 20 and the second display area 30. As described above, the first to third sub-pixels 201, 202, and 203 may be arranged in the PenTile™ scheme.

The third sub-pixels 203 may be repeatedly arranged in a first column 20*a* of the first sub-area 21 that is adjacent to the first boundary. For example, the third sub-pixel 203 may be disposed at an upper end in a second row (e.g., corresponding to the second row of the display area 10) and the first column 20*a* of the first sub-area 21, and the third sub-pixel 203 may be disposed at an upper end in a fourth row (e.g., corresponding to the fourth row of the display area 10) and the first column 20*a* of the first sub-area 21.

In addition, a second column 20*b* of the first sub-area 21 may be located between the first boundary and the first column 20*a* of the first sub-area 21. A third column 20*c* of the first sub-area 21 may be adjacent to the first column 20*a* of the first sub-area 21, and a fourth column 20*d* of the first sub-area 21 may be located between the first column 20*a* and the third column 20*c* of the first sub-area 21.

The second and first sub-pixels 202 and 201 may be repeatedly arranged in the third column 20*c* of the first sub-area 21. For example, the second sub-pixel 202 may be disposed at an upper end in a first row (e.g., corresponding to the first row of the display area 10) and the third column 20*c* of the first sub-area 21, and the first sub-pixel 201 may be disposed at an upper end in a third row (e.g., corresponding to the third row of the display area 10) and the third column 20*c* of the first sub-area 21.

In the embodiments, the first to third sub-pixels 201, 202, and 203 may not be disposed in the second column 20*b* and the fourth column 20*d* of the first sub-area 21.

For example, sizes of the first to third sub-pixels 201, 202, and 203 may be relatively greater than sizes of the first to third sub-pixels 101, 102, and 103, respectively. In this case, considering a process margin of a fine metal mask used in a process of forming a light emitting layer included in each of the first to third sub-pixels 201, 202, and 203, the first to third sub-pixels 201, 202, and 203 have to be spaced from each other by a distance that is relatively greater than a distance by which the first to third sub-pixels 101, 102, and 103 are spaced apart from each other. Accordingly, the first to third sub-pixels 201, 202, and 203 are not disposed in the second column 20*b* and the fourth column 20*d* of the first sub-area 21, so that a defect may not occur in the process of forming the light emitting layer of each of the first to third sub-pixels 201, 202, and 203. Furthermore, the first to third sub-pixels 101, 102, and 103 may be disposed in all the columns of the display area 10, and the display area 10 may not include a column in which the first to third sub-pixels 101, 102, and 103 are not disposed.

In this way, the first to third sub-pixels 201, 202, and 203 may be arranged over the whole of the first sub-area 21 and the second sub-area 22 in the PenTile™ scheme. In other words, the first to third sub-pixels 201, 202, and 203 may be arranged in a zigzag shape in an order of the second sub-pixel 202, the third sub-pixel 203, the first sub-pixel 201, and the third sub-pixel 203 in the first to fourth columns 20*a*, 20*b*, 20*c*, and 20*d* of the first sub-area 21. For reference, the second column 20*b*, the first column 20*a*, the fourth column 20*d*, and the third column 20*c* may be sequentially arranged from the first boundary in the first sub-area 21 in a direction from the display area 10 to the first display area 20.

Similarly, the first and second sub-pixels 101 and 102 may be repeatedly arranged in a first column 30*a* of the third sub-area 31 that is adjacent to the second boundary. For example, the first sub-pixel 201 may be disposed at an upper end in a first row (e.g., corresponding to the first row of the display area 10) and the first column 30*a* of the third sub-area 31, and the second sub-pixel 202 may be disposed at an upper end in a third row (e.g., corresponding to the third row of the display area 10) and the first column 30*a* of the third sub-area 31.

In addition, a second column 30*b* of the third sub-area 31 may be located between the second boundary and the first column 30*a* of the third sub-area 31. A third column 30*c* of the third sub-area 31 may be adjacent to the first column 30*a* of the third sub-area 31, and a fourth column 30d of the third sub-area 31 may be located between the first column 30a and the third column 30c of the third sub-area 31.

The third sub-pixels 203 may be repeatedly arranged in the third column 30c of the third sub-area 31. For example, the third sub-pixel 203 may be disposed at an upper end in a second row (e.g., corresponding to the second row of the display area 10) and the third column 30c of the third sub-area 31, and the third sub-pixel 203 may be disposed at an upper end in a fourth row (e.g., corresponding to the fourth row of the display area 10) and the third column 30c of the third sub-area 31.

In the embodiments, the first to third sub-pixels 201, 202, and 203 may not be disposed in the second column 30b and the fourth column 30d of the third sub-area 31.

For example, the sizes of the first to third sub-pixels 201, 202, and 203 may be relatively greater than the sizes of the first to third sub-pixels 101, 102, and 103, respectively. In this case, considering the process margin of the fine metal mask used in the process of forming the light emitting layer included in each of the first to third sub-pixels 201, 202, and 203, the first to third sub-pixels 201, 202, and 203 have to be spaced from each other by a distance that is relatively greater than the distance by which the first to third sub-pixels 101, 102, and 103 are spaced apart from each other. Accordingly, the first to third sub-pixels 201, 202, and 203 are not disposed in the second column 30b and the fourth column 30d of the third sub-area 31, so that a defect may not occur in the process of forming the light emitting layer of each of the first to third sub-pixels 201, 202, and 203. Furthermore, the first to third sub-pixels 101, 102, and 103 may be disposed in all the columns of the display area 10, and the display area 10 may not include a column in which the first to third sub-pixels 101, 102, and 103 are not disposed.

In this way, the first to third sub-pixels 201, 202, and 203 may be arranged over the whole of the third sub-area 31 and the fourth sub-area 32 in the PenTile™ scheme. In other words, the first to third sub-pixels 201, 202, and 203 may be arranged in a zigzag shape in an order of the first sub-pixel 201, the third sub-pixel 203, the second sub-pixel 202, and the third sub-pixel 203 in the first to fourth columns 30a, 30b, 30c, and 30d of the third sub-area 31. For reference, the second column 30b, the first column 30a, the fourth column 30d, and the third column 30c may be sequentially arranged from the second boundary in the third sub-area 31 in a direction from the display area 10 to the second display area 30. In addition, the second column 10b and the third column 10c of the display area 10 may be located between the first column 10a and the fourth column 10d of the display area 10, the second column 20b of the first sub-area 21 may be located between the first column 10a of the display area 10 and the first column 20a of the first sub-area 21, and the second column 30b of the third sub-area 31 may be located between the fourth column 10d of the display area 10 and the first column 30a of the third sub-area 31.

In the embodiments, a number of the first and second sub-pixels 101 and 102 arranged in the first column 10a of the display area 10 may be equal to a number of the third sub-pixels 103 arranged in the second column 10b of the display area 10. In addition, a number of the third sub-pixels 203 arranged in the first column 20a of the first sub-area 21 may be smaller than the number of the first and second sub-pixels 101 and 102 arranged in the first column 10a of the display area 10. For example, the number of the third sub-pixels 203 arranged in the first column 20a of the first sub-area 21 may be half the number of the first and second sub-pixels 101 and 102 arranged in the first column 10a of the display area 10.

As described above, the display device 100 may include the first to third pixel circuits. In the embodiments, the first to third pixel circuits connected to the first to third sub-pixels 101, 102, and 103 disposed in the display area 10 may be disposed in the display area 10 between the substrate 110 and the first to third sub-pixels 101, 102, and 103 (see FIG. 7).

For example, the first pixel circuit (e.g., a first pixel circuit PC11 of FIG. 7) connected to the first sub-pixel 101 (e.g., a first sub-pixel 101 of FIG. 7) disposed in the first row and the first column 10a of the display area 10 may overlap the first sub-pixel 101 in the first row and the first column 10a, the second pixel circuit connected to the second sub-pixel 102 disposed in the second row and the first column 10a of the display area 10 may overlap the second sub-pixel 102 in the second row and the first column 10a, the first pixel circuit connected to the first sub-pixel 101 disposed in the third row and the first column 10a of the display area 10 may overlap the first sub-pixel 101 in the third row and the first column 10a, and the second pixel circuit connected to the second sub-pixel 102 disposed in the fourth row and the first column 10a of the display area 10 may overlap the second sub-pixel 102 in the fourth row and the first column 10a. In addition, the third pixel circuit connected to the third sub-pixel 103 disposed in the first row and the second column 10b of the display area 10 may overlap the third sub-pixel 103 in the first row and the second column 10b, the third pixel circuit connected to the third sub-pixel 103 disposed in the second row and the second column 10b of the display area 10 may overlap the third sub-pixel 103 in the second row and the second column 10b, the third pixel circuit connected to the third sub-pixel 103 disposed in the third row and the second column 10b of the display area 10 may overlap the third sub-pixel 103 in the third row and the second column 10b, and the third pixel circuit connected to the third sub-pixel 103 disposed in the fourth row and the second column 10b of the display area 10 may overlap the third sub-pixel 103 in the fourth row and the second column 10b.

In addition, the first to third pixel circuits connected to the first to third sub-pixels 201, 202, and 203 disposed in the first display area 20 may be disposed in the first sub-area 21 between the substrate 110 and the first to third sub-pixels 201, 202, and 203 disposed in the first sub-area 21. In other words, the first to third pixel circuits may be disposed only in the first sub-area 21, and the first circuit structure 800 (e.g., a first circuit structure 800 shown in FIG. 9) may be disposed between the substrate 110 and the first to third sub-pixels 201, 202, and 203 disposed in the second sub-area 22.

For example, the third pixel circuit (e.g., a third pixel circuit PC23 of FIG. 8) connected to the third sub-pixel 203 (e.g., a third sub-pixel 203 shown in FIG. 8) disposed in the second row and the first column 20a of the first sub-area 21 may overlap the third sub-pixel 203 in the second row and the first column 20a. In this case, the third sub-pixel 203 disposed in the second row and the first column 20a may be connected to the third pixel circuit through a connection electrode 621 and a contact hole 721. In some embodiments, the third pixel circuit may also be disposed in the second row and the second column 20b (i.e., disposed in both the second row and the first column 20a and the second row and the second column 20b), or may be disposed only in the second row and the second column 20b.

In addition, the third pixel circuit connected to the third sub-pixel 203 disposed in the fourth row and the first column 20*a* of the first sub-area 21 may overlap the third sub-pixel 203 in the fourth row and the first column 20*a*. In this case, the third sub-pixel 203 disposed in the fourth row and the first column 20*a* may be connected to the third pixel circuit through a connection electrode 641 and a contact hole 741. In some embodiments, the third pixel circuit may also be disposed in the fourth row and the second column 20*b* (i.e., disposed in both the fourth row and the first column 20*a* and the fourth row and the second column 20*b*), or may be disposed only in the fourth row and the second column 20*b*.

Further, the second pixel circuit connected to the second sub-pixel 202 disposed in the first row and the third column 20*c* of the first sub-area 21 may overlap the second sub-pixel 202 in the first row and the third column 20*c*. In this case, the second sub-pixel 202 disposed in the first row and the third column 20*c* may be connected to the second pixel circuit through a connection electrode 611 and a contact hole 711. In some embodiments, the second pixel circuit may also be disposed in the first row and the fourth column 20*d* (i.e., disposed in both the first row and the third column 20*c* and the first row and the fourth column 20*d*), or may be disposed only in the first row and the fourth column 20*d*.

Moreover, the first pixel circuit connected to the first sub-pixel 201 disposed in the third row and the third column 20*c* of the first sub-area 21 may overlap the first sub-pixel 201 in the third row and the third column 20*c*. In this case, the first sub-pixel 201 disposed in the third row and the third column 20*c* may be connected to the first pixel circuit through a connection electrode 631 and a contact hole 731. In some embodiments, the first pixel circuit may also be disposed in the third row and the fourth column 20*d* (i.e., disposed in both the third row and the third column 20*c* and the third row and the fourth column 20*d*), or may be disposed only in the third row and the fourth column 20*d*.

In this way, the first to third pixel circuits connected to the first to third sub-pixels 201, 202, and 203 disposed in fifth to eighth columns of the first sub-area 21 may also overlap the first to third sub-pixels 201, 202, and 203 in the fifth to eighth columns, respectively. In other words, the first to third sub-pixels 201, 202, and 203 disposed in the fifth to eighth columns may be connected to the first to third pixel circuits through connection electrodes 612, 622, 632, and 642 and contact holes 712, 722, 732, and 742, respectively.

The first pixel circuit (e.g., a first pixel circuit PC21 shown in FIG. 10) connected to the first sub-pixel 201 (e.g., a first sub-pixel 201 shown in FIG. 9) disposed in the first row and the seventh column of the second sub-area 22 may be disposed in the first row and the first column 20*a* of the first sub-area 21. In this case, the first sub-pixel 201 disposed in the first row and the seventh column may be connected to the first pixel circuit through a connection electrode 614 and a contact hole 714. In some embodiments, the first pixel circuit may also be disposed in the first row and the second column 20*b* of the first sub-area 21 (i.e., disposed in both the first row and the second column 20*b* and the first row and the second column 20*b*), or may be disposed only in the first row and the second column 20*b*.

In addition, the second sub-pixel connected to the second sub-pixel 202 disposed in the first row and the third column of the second sub-area 22 may be disposed in the first row and the fifth column of the first sub-area 21. In this case, the second sub-pixel 202 disposed in the first row and the third column may be connected to the second pixel circuit through a connection electrode 613 and a contact hole 713. In some embodiments, the second sub-pixel may also be disposed in the first row and the sixth column of the first sub-area 21 (i.e., disposed in both the first row and the fifth column and the first row and the sixth column), or may be disposed only in the first row and the sixth column.

Further, the third pixel circuit connected to the third sub-pixel 203 disposed in the second row and the fifth column of the second sub-area 22 may be disposed in the second row and the third column 20*c* of the first sub-area 21. In this case, the third sub-pixels 203 disposed in the second row and the fifth column may be connected to the third pixel circuit through a connection electrode 624 and a contact hole 724. In some embodiments, the third pixel circuit may also be disposed in the second row and the fourth column 20*d* of the first sub-area 21 (i.e., disposed in both the second row and the third column 20*c* and the second row and the fourth column 20*d*), or may be disposed only in the second row and the fourth column 20*d*.

Moreover, the third pixel circuit connected to the third sub-pixel 203 disposed in the second row and the first column of the second sub-area 22 may be disposed in the second row and the seventh column of the first sub-area 21. In this case, the third sub-pixel 203 disposed in the second row and the first column may be connected to the third pixel circuit through a connection electrode 623 and a contact hole 723. In some embodiments, the third pixel circuit may also be disposed in the second row and the eighth column of the first sub-area 21 (i.e., disposed in both the second row and the first column and the second row and the eighth column), or may be disposed only in the second row and the eighth column.

In this way, the first to third pixel circuits connected to the first to third sub-pixels 201, 202, and 203 disposed in the third and fourth rows of the second sub-area 22 may also be disposed in the first column 20*a*, the third column 20*c*, the fifth column, and the seventh column of the first sub-area 21. In other words, the first to third sub-pixels 201, 202, and 203 disposed in the third and fourth rows may be connected to the first to third pixel circuits through connection electrodes 633, 634, 643, and 644 and contact holes 733, 734, 743, and 744, respectively.

Furthermore, the first to third pixel circuits connected to the first to third sub-pixels 201, 202, and 203 disposed in the second display area 30 may be disposed in the third sub-area 31 between the substrate 110 and the first to third sub-pixels 201, 202, and 203 disposed in the third sub-area 31. In other words, the first to third pixel circuits may be disposed only in the third sub-area 31, and the second circuit structure 900 may be disposed between the substrate 110 and the first to third sub-pixels 201, 202, and 203 disposed in the fourth sub-area 32.

Since an arrangement of the first to third pixel circuits connected to the first to third sub-pixels 201, 202, and 203 disposed in the second display area 30 is similar to the arrangement of the first to third pixel circuits connected to the first to third sub-pixels 201, 202, and 203 disposed in the first display area 20, descriptions thereof will be omitted for sake of brevity. In other words, the first to third sub-pixels 201, 202, and 203 disposed in first to eighth columns of the third sub-area 31 may be connected to the first to third pixel circuits through connection electrodes 811, 812, 821, 822, 831, 832, 841, and 842 and contact holes 911, 912, 921, 922, 931, 932, 941, and 942, respectively. In addition, the first to third sub-pixels 201, 202, and 203 disposed in first to eighth columns of the fourth sub-area 32 may be connected to the first to third pixel circuits through connection electrodes 813, 814, 823, 824, 833, 834, 843, and 844 and contact holes 913, 914, 923, 924, 933, 934, 943, and 944, respectively.

According to the display device 100 of the embodiments described herein, the first to third sub-pixels 201, 202, and 203 are not disposed in the second column 20*b* of the first sub-area 21 and the second column 30*b* of the third sub-area 31, so that a defect may not occur in the process of forming the light emitting layer of each of the first to third sub-pixels 201, 202, and 203 that are adjacent to the first and second boundaries.

However, although the display device 100 according to embodiments described herein has been described as specifically being an organic light emitting diode display device, the configuration of the embodiments described herein is not limited thereto. In other embodiments, the display device 100 may include a liquid crystal display device (LCD), a field emission display device (FED), a plasma display device (PDP), and an electrophoretic display device (EPD).

Figure 7:
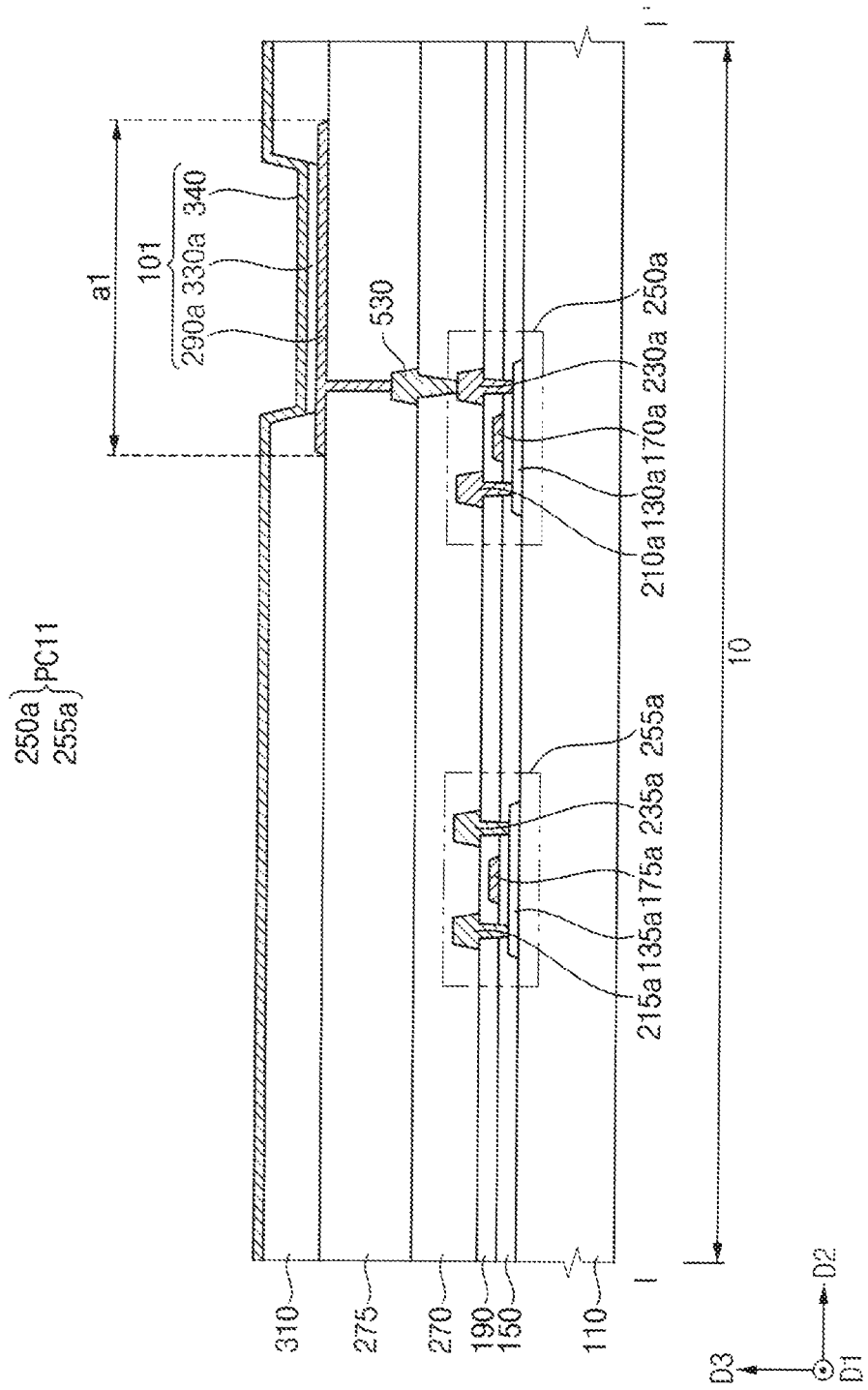
FIG. 7 is a cross-sectional view taken along line I-I' of FIG. 5.
Figure 8:
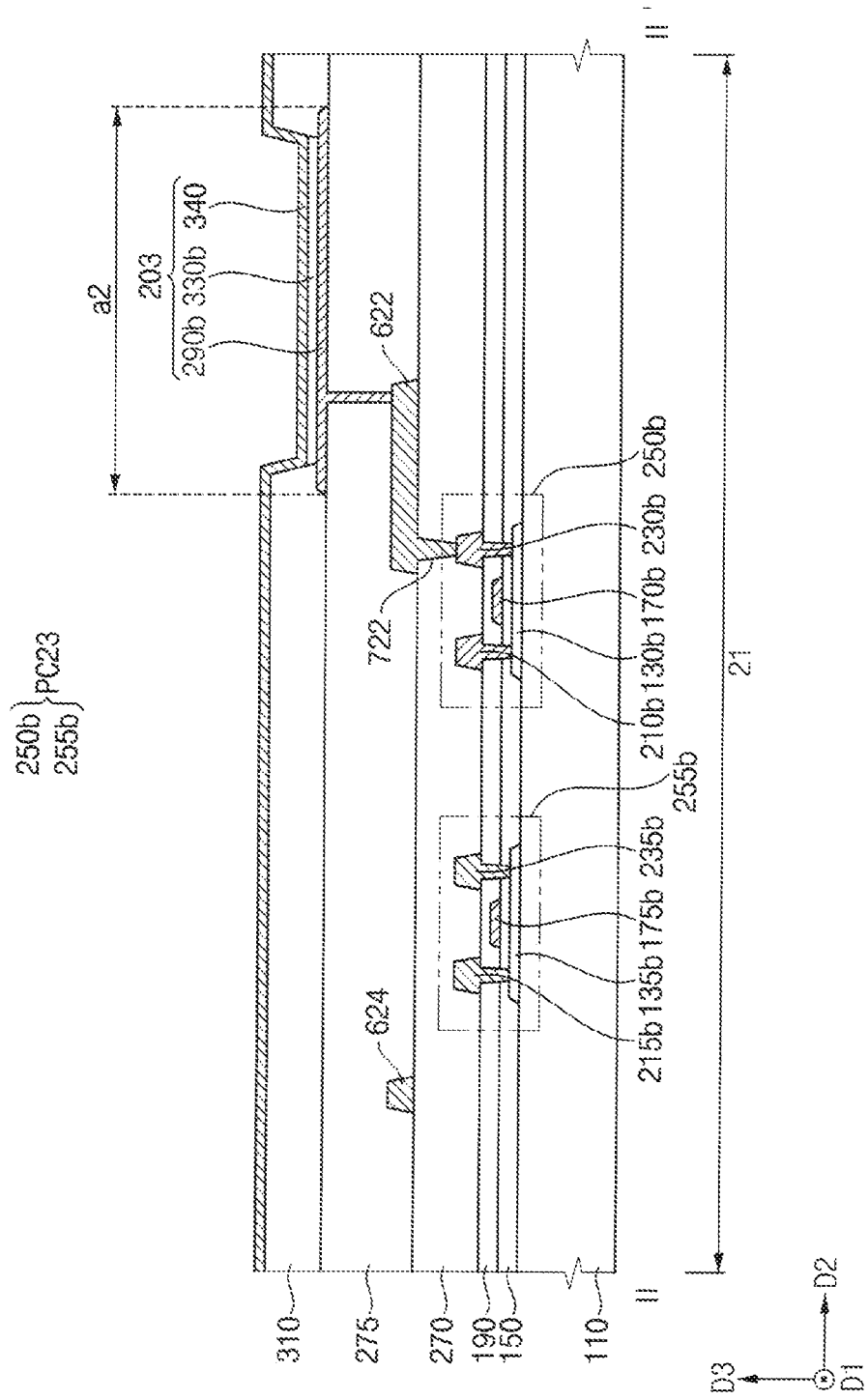
FIG. 8 is a cross-sectional view taken along line II-II' of FIG. 5.
Figure 9:
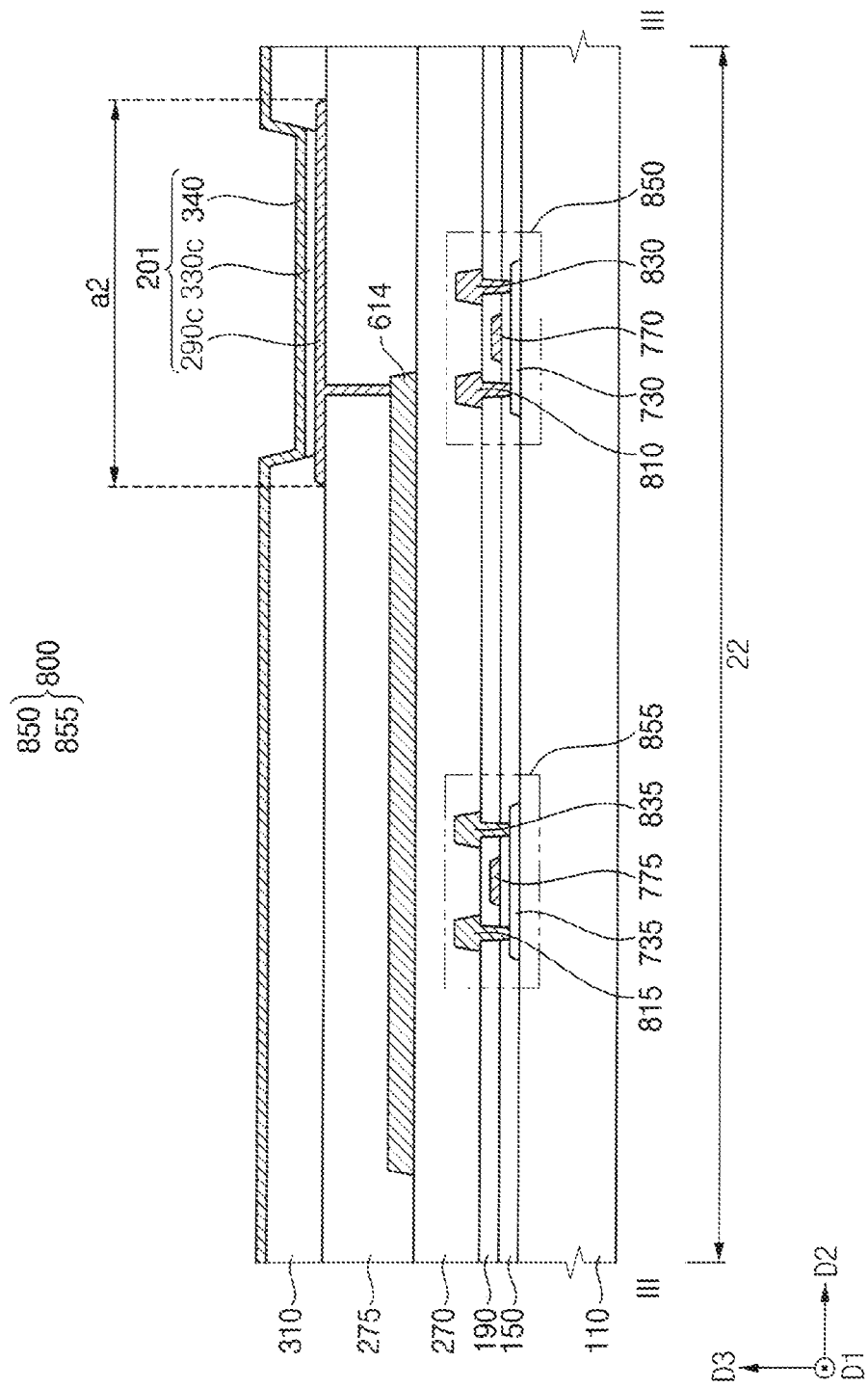
FIG. 9 is a cross-sectional view taken along line III-III' of FIG. 5.
Figure 10:
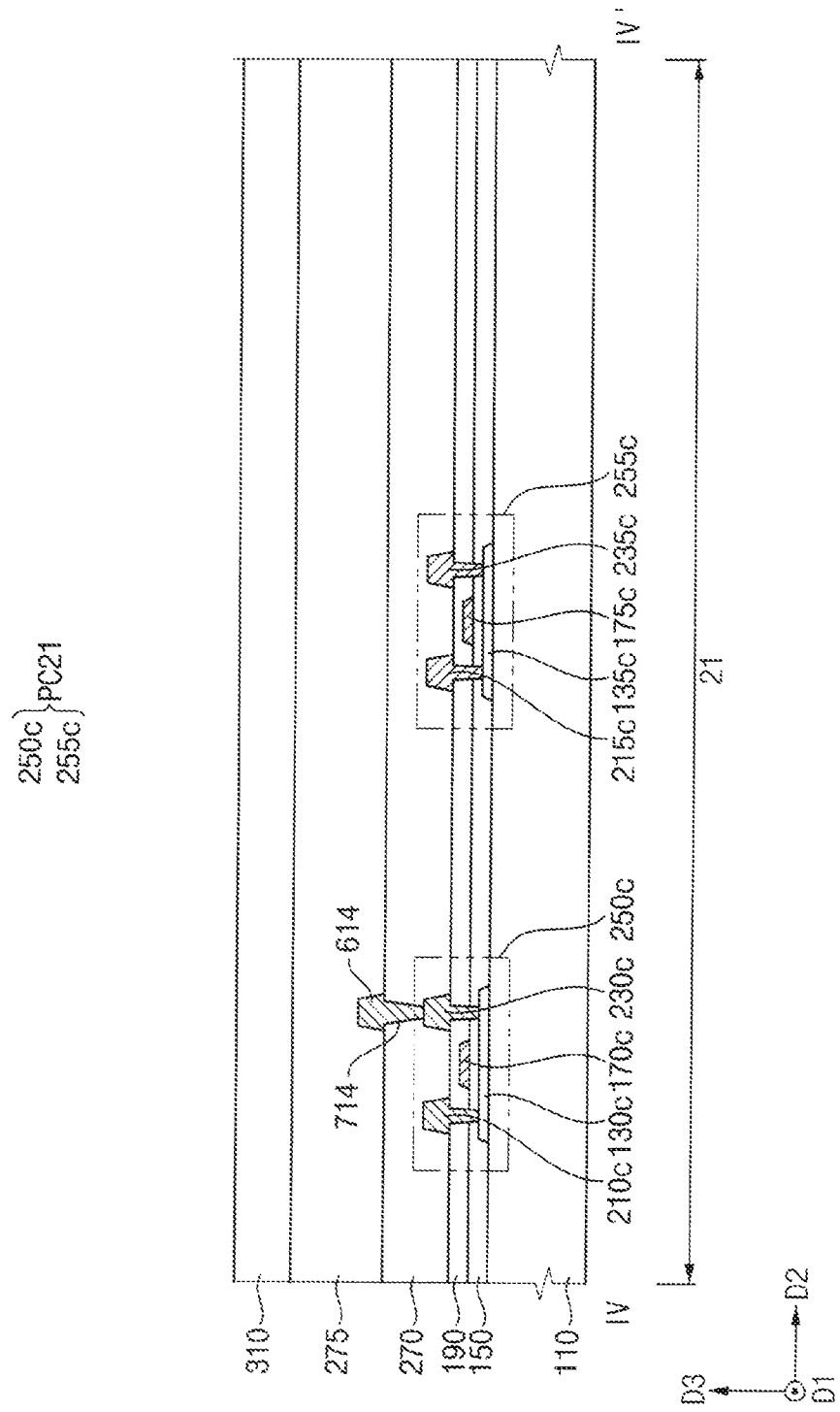
FIG. 10 is a cross-sectional view taken along line IV-IV' of FIG. 5.

FIG. 7 is a cross-sectional view taken along line I-I' of FIG. 5, and FIG. 8 is a cross-sectional view taken along line II-II' of FIG. 5. FIG. 9 is a cross-sectional view taken along line III-III' of FIG. 5, and FIG. 10 is a cross-sectional view taken along line IV-IV' of FIG. 5.

Referring to FIGS. 5, 7, 8, 9, and 10, the display device 100 may include a substrate 110, a first pixel circuit PC11 of the display area 10, a first sub-pixel 101 of the display area 10, a third pixel circuit PC23 of the first display area 20, a third sub-pixel 203 of the first display area 20, a first pixel circuit PC21 of the first display area 20, a first sub-pixel 201 of the first display area 20, a first circuit structure 800 of the second sub-area 22, a gate insulating layer 150, an interlayer insulating layer 190, a first planarization layer 270, a second planarization layer 275, connection electrodes 530, 614, 622, and 624, a pixel defining layer 310, and the like.

In this case, the first pixel circuit PC11 may include a first transistor 255*a* including an active layer 135*a*, a gate electrode 175*a*, a source electrode 215*a*, and a drain electrode 235*a*, and a second transistor 250*a* including an active layer 130*a*, a gate electrode 170*a*, a source electrode 210*a*, and a drain electrode 230*a*, and the first sub-pixel 101 may include a lower electrode 290*a*, a light emitting layer 330*a*, and an upper electrode 340. The first pixel circuit PC11 may correspond to the pixel circuit PC of FIG. 4, and the first sub-pixel 101 may correspond to the organic light emitting diode OLED of FIG. 4. For example, the first transistor 255*a* may correspond to the first transistor TR1 of the pixel circuit PC, and the second transistor 250*a* may correspond to one of the second to seventh transistors TR2, TR3, TR4, TR5, TR6, and TR7 of the pixel circuit PC.

In addition, the third pixel circuit PC23 may include a third transistor 255*b* including an active layer 135*b*, a gate electrode 175*b*, a source electrode 215*b*, and a drain electrode 235*b*, and a fourth transistor 250*b* including an active layer 130*b*, a gate electrode 170*b*, a source electrode 210*b*, and a drain electrode 230*b*, and the third sub-pixel 203 may include a lower electrode 290*b*, a light emitting layer 330*b*, and an upper electrode 340. The third pixel circuit PC23 may correspond to the pixel circuit PC of FIG. 4, and the third sub-pixel 203 may correspond to the organic light emitting diode OLED of FIG. 4. For example, the third transistor 255*b* may correspond to the first transistor TR1 of the pixel circuit PC, and the fourth transistor 250*b* may correspond to one of the second to seventh transistors TR2, TR3, TR4, TR5, TR6, and TR7 of the pixel circuit PC.

Further, the first pixel circuit PC21 may include a fifth transistor 255*c* including an active layer 135*c*, a gate electrode 175*c*, a source electrode 215*c*, and a drain electrode 235*c*, and a sixth transistor 250*c* including an active layer 130*c*, a gate electrode 170*c*, a source electrode 210*c*, and a drain electrode 230*c*, and the first sub-pixel 201 may include a lower electrode 290*c*, a light emitting layer 330*c*, and an upper electrode 340. The first pixel circuit PC21 may correspond to the pixel circuit PC of FIG. 4, and the first sub-pixel 201 may correspond to the organic light emitting diode OLED of FIG. 4. For example, the fifth transistor 255*c* may correspond to the first transistor TR1 of the pixel circuit PC, and the sixth transistor 250*c* may correspond to one of the second to seventh transistors TR2, TR3, TR4, TR5, TR6, and TR7 of the pixel circuit PC.

Moreover, the first circuit structure 800 may include a first circuit transistor 855 including an active layer 735, a gate electrode 775, a source electrode 815, and a drain electrode 835, and a second circuit transistor 850 including an active layer 730, a gate electrode 770, a source electrode 810, and a drain electrode 830. The first circuit structure 800 may correspond to the gate driver of FIG. 2 or the emission signal driver of FIG. 3. For example, the first circuit transistor 855 or the second circuit transistor 850 may correspond to one of the first to eighth transistors M1, M2, M3, M4, M5, M6, M7, and M8 of FIG. 2, or may correspond to one of the eleventh to twentieth transistors M11, M12, M13, M14, M15, M16, M17, M18, M19, and M20 of FIG. 3.

Furthermore, the display device 100 may further include second and third pixel circuits of the display area 10, second and third sub-pixels 102 and 103 of the display area 10, a second pixel circuit of the first display area 20, a second sub-pixel 202 of the first display area 20, first to third pixel circuits of the second display area 30, first to third sub-pixels 201, 202, and 203 of the second display area 30, and a second circuit structure 900 of the fourth sub-area 32, which are shown in FIGS. 5 and 6.

The substrate 110 including a transparent or opaque material may be provided. The substrate 110 may include a quartz substrate, a synthetic quartz substrate, a calcium fluoride substrate, a fluorine-doped quartz substrate (F-doped quartz substrate), a soda lime glass substrate, a non-alkali glass substrate, and the like.

In other embodiments, the substrate 110 may be a transparent resin substrate having flexibility. An example of the transparent resin substrate that may be used as the substrate 110 includes a polyimide substrate. In this case, the polyimide substrate may have a stacked structure including a first polyimide layer, a barrier film layer, a second polyimide layer, and the like.

Since the display device 100 includes the display area 10, the first display area 20, and the second display area 30, the substrate 110 may also be divided into a display area 10, a first display area 20, and a second display area 30.

As shown in FIG. 7, the first transistor 255*a* and the second transistor 250*a* may be disposed in the display area 10 on the substrate 110. In other words, the first pixel circuit PC11 may be disposed in the display area 10 between the substrate 110 and the second planarization layer 275 to at least partially overlap the first sub-pixel 101.

The connection electrode 530 may be disposed in the display area 10 on the first pixel circuit PC11. The connection electrode 530 may be connected to the drain electrode 230*a* through a contact hole formed in the first planarization layer 270.

The first sub-pixel 101 may be disposed on the first pixel circuit PC11. The first sub-pixel 101 may be electrically connected to the first pixel circuit PC11 through the connection electrode 530. In other words, the lower electrode 290*a* may be connected to the connection electrode 530 through a contact hole formed in the second planarization layer 275. In the embodiments, the lower electrode 290a may have a first width a1, and the contact hole formed in the first planarization layer 270 may overlap the lower electrode 290a.

As shown in FIG. 8, the third transistor 255b and the fourth transistor 250b may be disposed in the first sub-area 21 on the substrate 110. In other words, the third pixel circuit PC23 may be disposed in the first sub-area 21 between the substrate 110 and the second planarization layer 275 to at least partially overlap the third sub-pixel 203.

The connection electrodes 622 and 624 may be disposed in the first sub-area 21 on the third pixel circuit PC23. The connection electrode 622 may be connected to the drain electrode 230b through the contact hole 722 formed in the first planarization layer 270. In addition, the connection electrode 624 may extend in the first direction D1 on the first planarization layer 270.

The third sub-pixel 203 may be disposed on the third pixel circuit PC23. The third sub-pixel 203 may be electrically connected to the third pixel circuit PC23 through the connection electrode 622. In other words, the lower electrode 290b may be connected to the connection electrode 622 through a contact hole formed in the second planarization layer 275. In the embodiments, the lower electrode 290b may have a second width a2 that is greater than the first width a1, and the contact hole 722 formed in the first planarization layer 270 may not overlap the lower electrode 290b.

As shown in FIGS. 9 and 10, the first circuit transistor 855 and the second circuit transistor 850 may be disposed in the second sub-area 22 on the substrate 110. In other words, the first circuit structure 800 may be disposed in the second sub-area 22 between the substrate 110 and the second planarization layer 275 to at least partially overlap the first sub-pixel 201.

The connection electrode 614 may be disposed in the second sub-area 22 on the first circuit structure 800. The connection electrode 614 may not be electrically connected to the first circuit structure 800.

The fifth transistor 255c and the sixth transistor 250c may be disposed in the first sub-area 21 on the substrate 110. In other words, the first pixel circuit PC21 may be disposed in the first sub-area 21 between the substrate 110 and the second planarization layer 275 without overlapping the first sub-pixel 201 disposed in the second sub-area 22.

The connection electrode 614 may be disposed in the first sub-area 21 on the first pixel circuit PC21. The connection electrode 614 may be connected to the drain electrode 230c through the contact hole 714 formed in the first planarization layer 270. In other words, the connection electrode 614 may be disposed in the second sub-area 22 and the first sub-area 21 on the first planarization layer 270, and the connection electrode 614 may extend in the first direction D1 and the second direction D2 on the first planarization layer 270.

The first sub-pixel 201 may be disposed on the first circuit structure 800. The first sub-pixel 201 may be electrically connected to the first pixel circuit PC21 disposed in the first sub-area 21 through the connection electrode 614. In other words, the lower electrode 290c may be connected to the connection electrode 614 through a contact hole formed in the second planarization layer 275. In the embodiments, the lower electrode 290c may have the second width a2, and the contact hole 714 formed in the first planarization layer 270 may not overlap the lower electrode 290c.

The active layers 130a, 135a, 130b, 135b, 130c, 135c, 730, and 735 may be disposed on the substrate 110. Each of the active layers 130a, 135a, 130b, 135b, 130c, 135c, 730, and 735 may include a metal oxide semiconductor, amorphous silicon, polysilicon, an organic semiconductor, or the like.

The gate insulating layer 150 may be disposed on the active layers 130a, 135a, 130b, 135b, 130c, 135c, 730, and 735. The gate insulating layer 150 may include a silicon compound, metal oxide, and the like. For example, the gate insulating layer 150 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and the like. In some embodiments, the gate insulating layer 150 may have a multilayer structure including a plurality of insulating layers formed of mutually different materials.

The gate electrodes 170a, 175a, 170b, 175b, 170c, 175c, 770, and 775 may be disposed on the gate insulating layer 150. Each of the gate electrodes 170a, 175a, 170b, 175b, 170c, 175c, 770, and 775 may include a metal, a metal alloy, metal nitride, conductive metal oxide, a transparent conductive material, and the like. For example, each of the gate electrodes 170a, 175a, 170b, 175b, 170c, 175c, 770, and 775 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), and the like. These may be used alone or in combination with each other. In some embodiments, each of the gate electrodes 170a, 175a, 170b, 175b, 170c, 175c, 770, and 775 may have a multilayer structure including a plurality of metal layers.

The interlayer insulating layer 190 may be disposed on the gate electrodes 170a, 175a, 170b, 175b, 170c, 175c, 770, and 775. The interlayer insulating layer 190 may include a silicon compound, metal oxide, and the like. In some embodiments, the interlayer insulating layer 190 may have a multilayer structure including a plurality of insulating layers formed of mutually different materials.

The source electrodes 210a, 215a, 210b, 215b, 210c, 215c, 810, and 815 and the drain electrodes 230a, 235a, 230b, 235b, 230c, 235c, 830, and 835 may be disposed on the interlayer insulating layer 190. Each of the source electrodes 210a, 215a, 210b, 215b, 210c, 215c, 810, and 815 and the drain electrodes 230a, 235a, 230b, 235b, 230c, 235c, 830, and 835 may include a metal, a metal alloy, metal nitride, conductive metal oxide, a transparent conductive material, and the like. In some embodiments, each of the source electrodes 210a, 215a, 210b, 215b, 210c, 215c, 810, and 815 and the drain electrodes 230a, 235a, 230b, 235b, 230c, 235c, 830, and 835 may have a multilayer structure including a plurality of metal layers.

The first planarization layer 270 may be disposed on the source electrodes 210a, 215a, 210b, 215b, 210c, 215c, 810, and 815 and the drain electrodes 230a, 235a, 230b, 235b, 230c, 235c, 830, and 835. The planarization layer 270 may include an organic insulating material. For example, the planarization layer 270 may include a photoresist, a polyacryl-based resin, a polyimide-based resin, a polyamidebased resin, a siloxane-based resin, an acryl-based resin, an epoxy-based resin, and the like.

The second planarization layer 275 may be disposed on the first planarization layer 270. The second planarization layer 275 may include an organic insulating material.

The pixel defining layer 310 may be disposed on the second planarization layer 275. The pixel defining layer 310 may include an organic insulating material.

Figure 11:
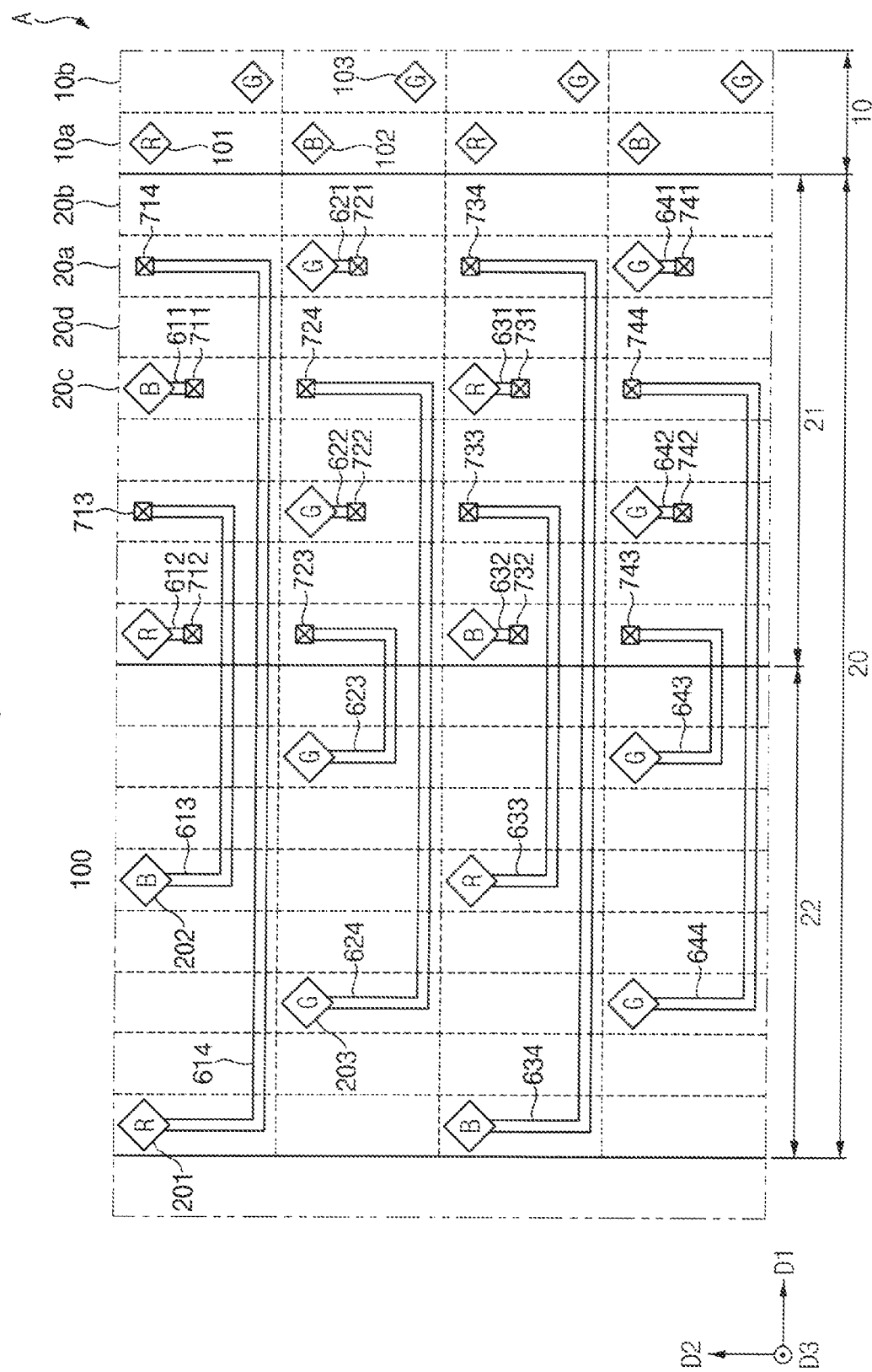
FIGS. 11 and 12 are plan views showing one example of a connection electrode shown in FIGS. 5 and 6.
Figure 12:
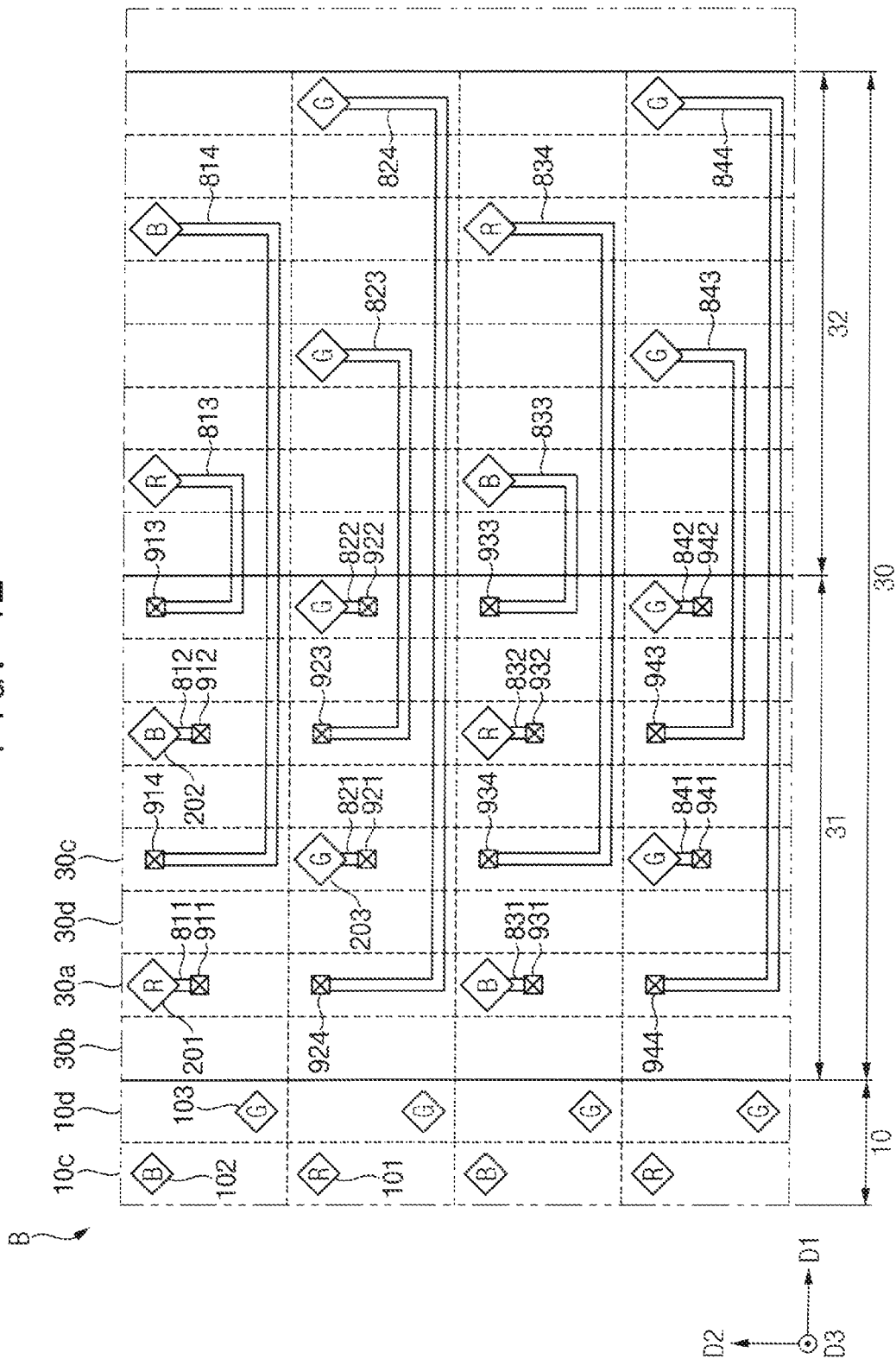

FIGS. 11 and 12 are plan views showing one example of a connection electrode shown in FIGS. 5 and 6.

Referring to FIGS. 11 and 12, the connection electrode 614 may extend in the second direction D2 in the first row and the first column 20a of the first sub-area 21, and the contact hole 714 may be located at an upper end of the first row and the first column 20a. In addition, the connection electrode 613 may extend in the second direction D2 in the first row and the fifth column of the first sub-area 21, and the contact hole 713 may be located at an upper end of the first row and the fifth column.

The connection electrode 624 may extend in the second direction D2 in the second row and the third column 20c of the first sub-area 21, and the contact hole 724 may be located at an upper end of the second row and the third column 20c. In addition, the connection electrode 623 may extend in the second direction D2 in the second row and the seventh column of the first sub-area 21, and the contact hole 723 may be located at an upper end of the second row and the seventh column.

The connection electrode 634 may extend in the second direction D2 in the third row and the first column 20a of the first sub-area 21, and the contact hole 734 may be located at an upper end of the third row and the first column 20a. In addition, the connection electrode 633 may extend in the second direction D2 in the third row and the fifth column of the first sub-area 21, and the contact hole 733 may be located at an upper end of the third row and the fifth column.

The connection electrode 644 may extend in the second direction D2 in the fourth row and the third column 20c of the first sub-area 21, and the contact hole 744 may be located at an upper end of the fourth row and the third column 20c. In addition, the connection electrode 643 may extend in the second direction D2 in the fourth row and the seventh column of the first sub-area 21, and the contact hole 743 may be located at an upper end of the fourth row and the seventh column.

In this way, each of the connection electrodes 813, 814, 823, 824, 833, 834, 843, and 844 disposed in the first to fourth rows of the second display area 30 may extend in the second direction D2, and the contact holes 913, 914, 923, 924, 933, 934, 943, and 944 may be located at the upper ends.

Figure 13:
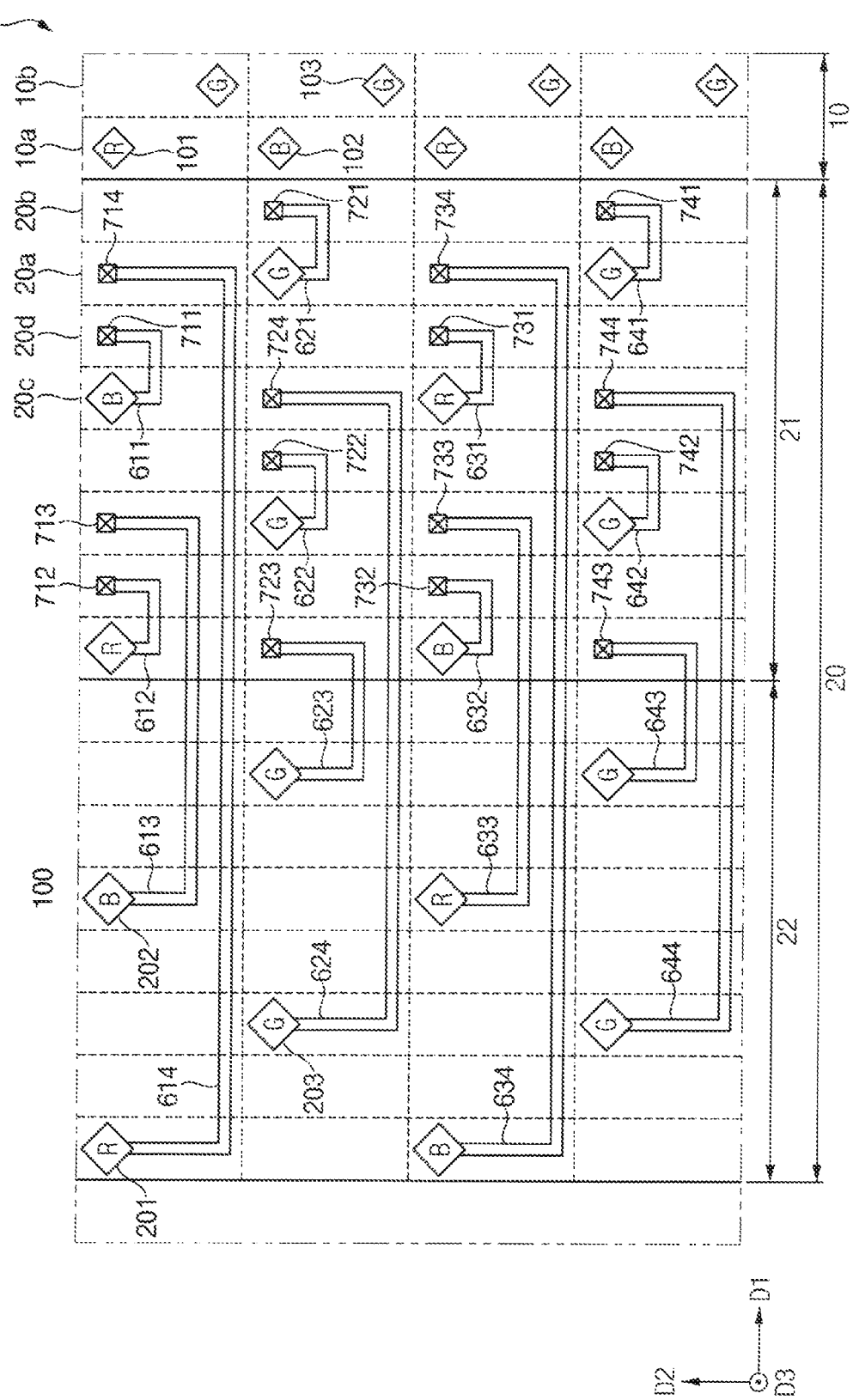
FIGS. 13 and 14 are plan views showing another example of the connection electrode shown in FIGS. 5 and 6.
Figure 14:
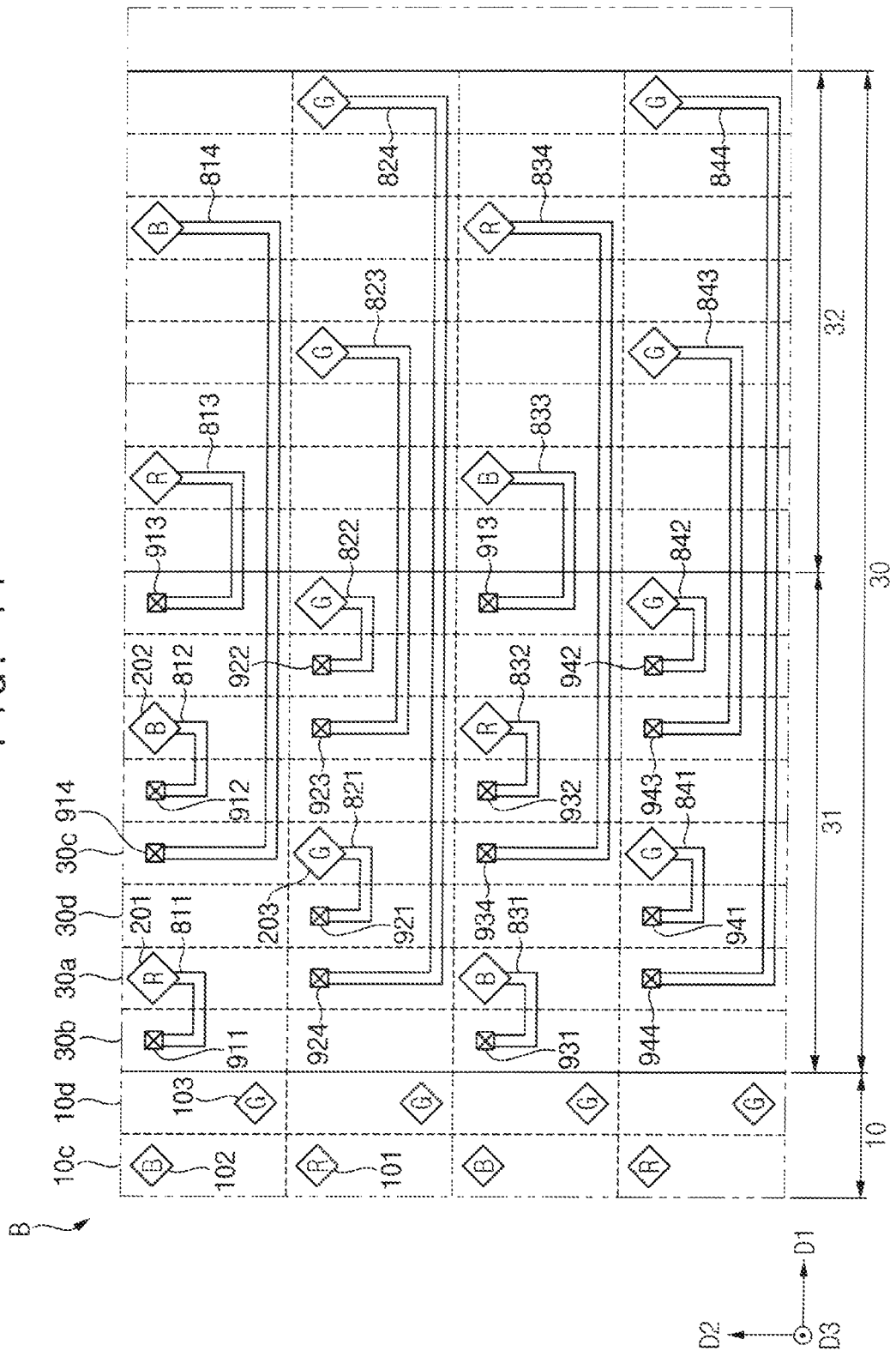

FIGS. 13 and 14 are plan views showing another example of the connection electrode shown in FIGS. 5 and 6.

Referring to FIGS. 13 and 14, the connection electrode 611 may extend to the first row and the fourth column 20d of the first sub-area 21, and may extend in the second direction D2 from the first row and the fourth column 20d so that the contact hole 711 may be located at an upper end of the first row and the fourth column 20d. In addition, the connection electrode 612 may extend to the first row and the eighth column of the first sub-area 21, and may extend in the second direction D2 from the first row and the eighth column so that the contact hole 712 may be located at an upper end of the first row and the eighth column.

The connection electrode 621 may extend to the second row and the second column 20b of the first sub-area 21, and may extend in the second direction D2 from the second row and the second column 20b so that the contact hole 721 may be located at an upper end of the second row and the second column 20b. In addition, the connection electrode 622 may extend to the second row and the sixth column of the first sub-area 21, and may extend in the second direction D2 from the second row and the sixth column so that the contact hole 722 may be located at an upper end of the second row and the sixth column.

The connection electrode 631 may extend to the third row and the fourth column 20d of the first sub-area 21, and may extend in the second direction D2 from the third row and the fourth column 20d so that the contact hole 731 may be located at an upper end of the third row and the fourth column 20d. In addition, the connection electrode 632 may extend to the third row and the eighth column of the first sub-area 21, and may extend in the second direction D2 from the third row and the eighth column so that the contact hole 732 may be located at an upper end of the third row and the eighth column.

The connection electrode 641 may extend to the fourth row and the second column 20b of the first sub-area 21, and may extend in the second direction D2 from the fourth row and the second column 20b so that the contact hole 741 may be located at an upper end of the fourth row and the second column 20b. In addition, the connection electrode 642 may extend to the fourth row and the sixth column of the first sub-area 21, and may extend in the second direction D2 from the fourth row and the sixth column so that the contact hole 742 may be located at an upper end of the fourth row and the sixth column.

In this way, each of the connection electrodes 811, 812, 821, 822, 831, 832, 841, and 842 disposed in the first to fourth rows of the second display area 30 may extend in a direction opposite to the first direction D1 and the second direction D2, and the contact holes 911, 912, 921, 922, 931, 932, 941, and 942 may be located at the upper ends.

Figure 15:
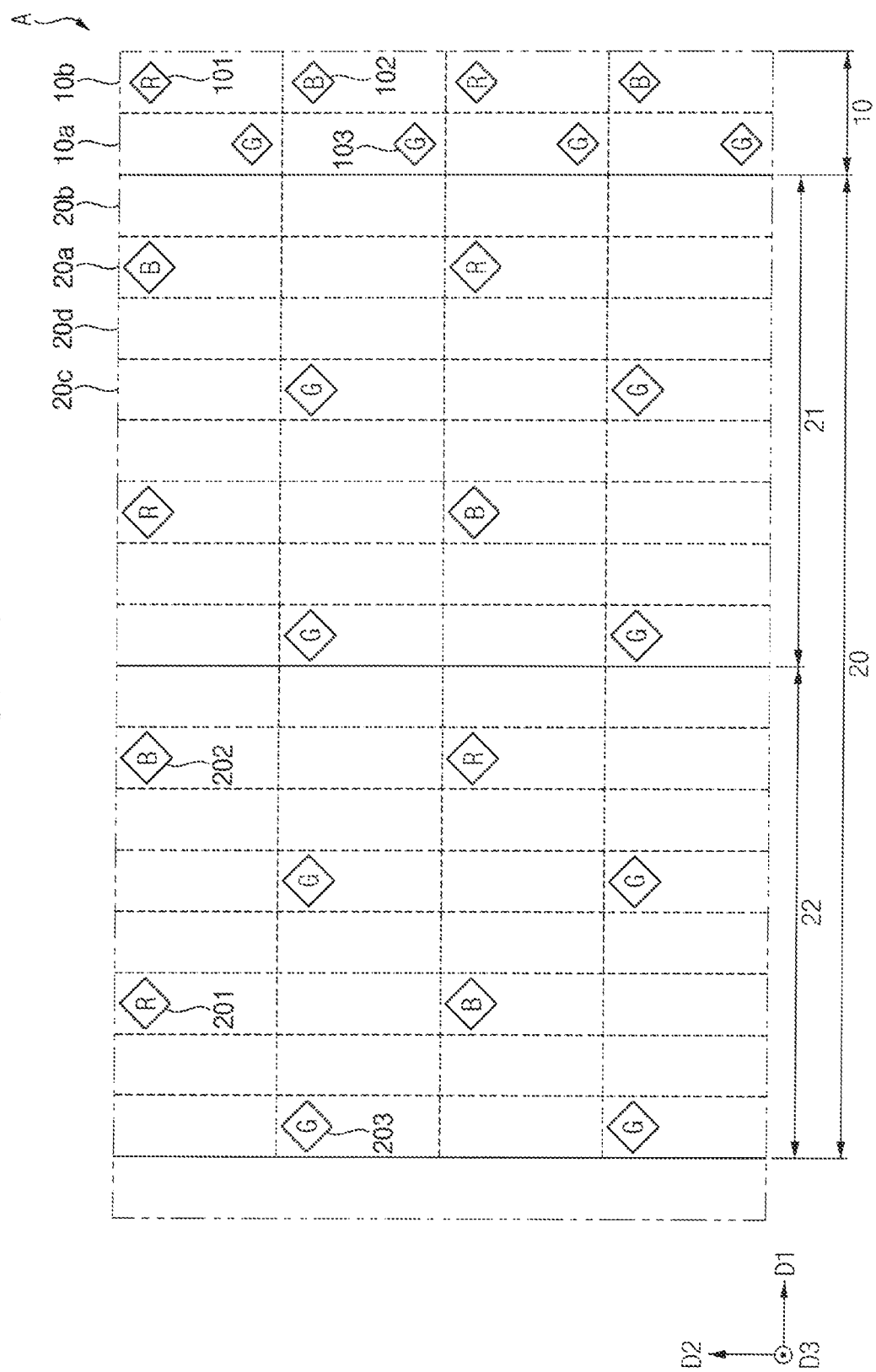
FIGS. 15 and 16 are plan views showing one example of an arrangement of sub-pixels included in the display device of FIG. 1.
Figure 16:
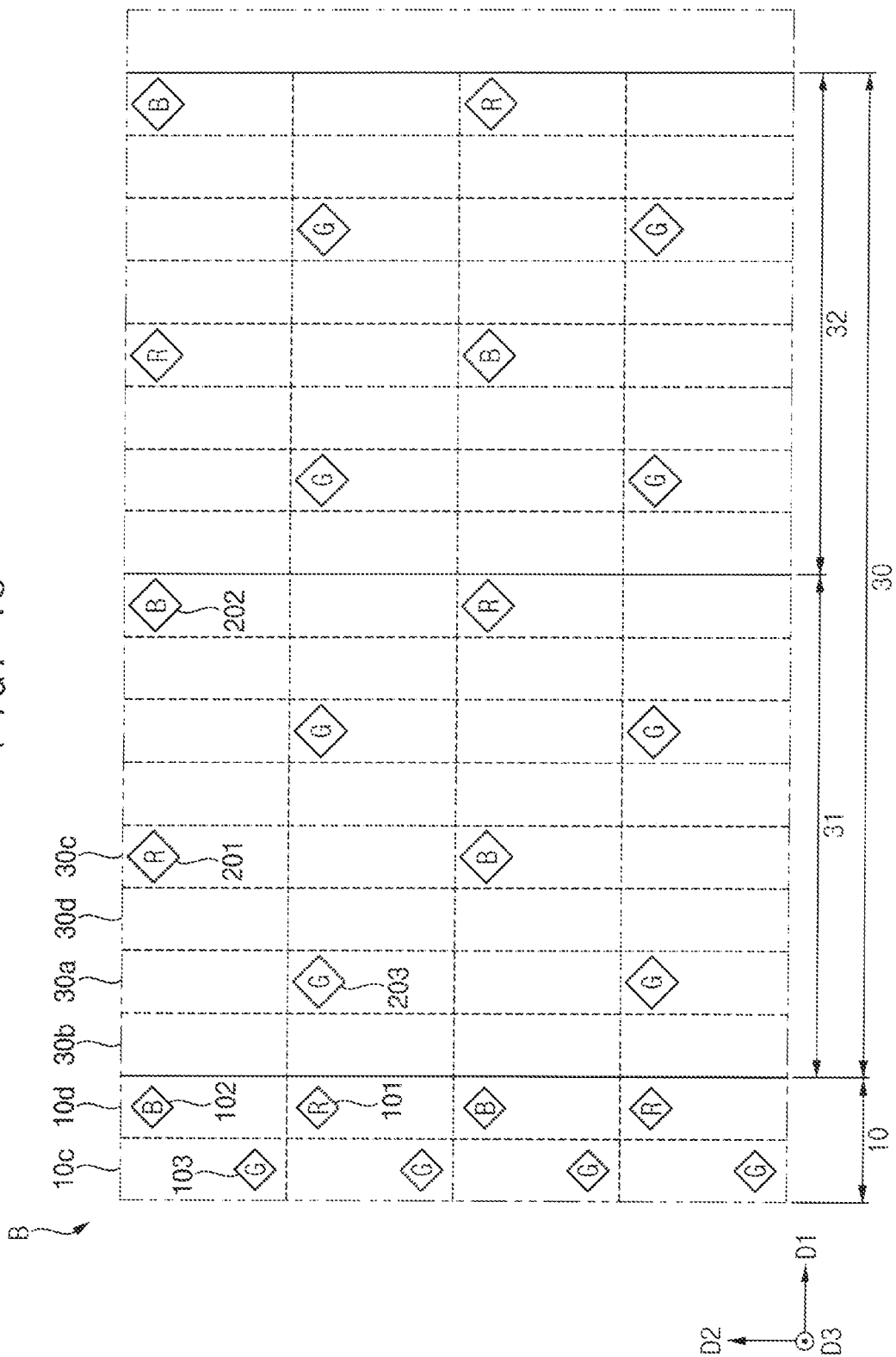

FIGS. 15 and 16 are plan views showing one example of an arrangement of sub-pixels included in the display device of FIG. 1.

Referring to FIGS. 15 and 16, the first to third sub-pixels R, B, and G may be arranged such that red/green-blue/green (RG-BG) sub-pixels are repeatedly arranged in the first direction D1. For example, when compared with one PenTile™ structure of FIGS. 5 and 6, one PenTile™ structure of FIGS. 15 and 16 may be symmetrical in the second direction D2. In other embodiments, one PenTile™ structure may be implemented as a structure that is symmetrical in the first direction D1.

Figure 17:
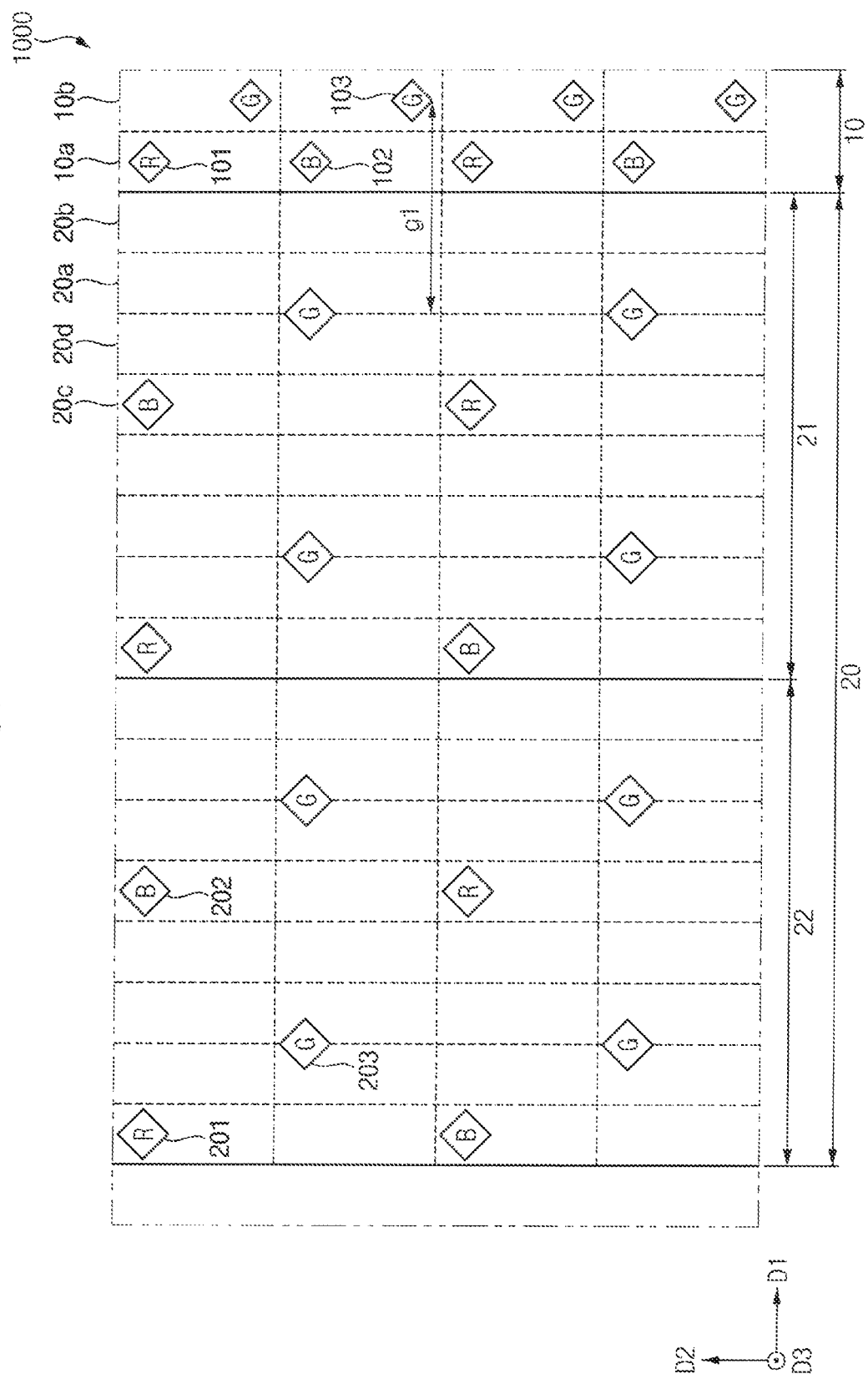
FIGS. 17 and 18 are plan views showing a display device according to embodiments of the inventive concepts.
Figure 18:
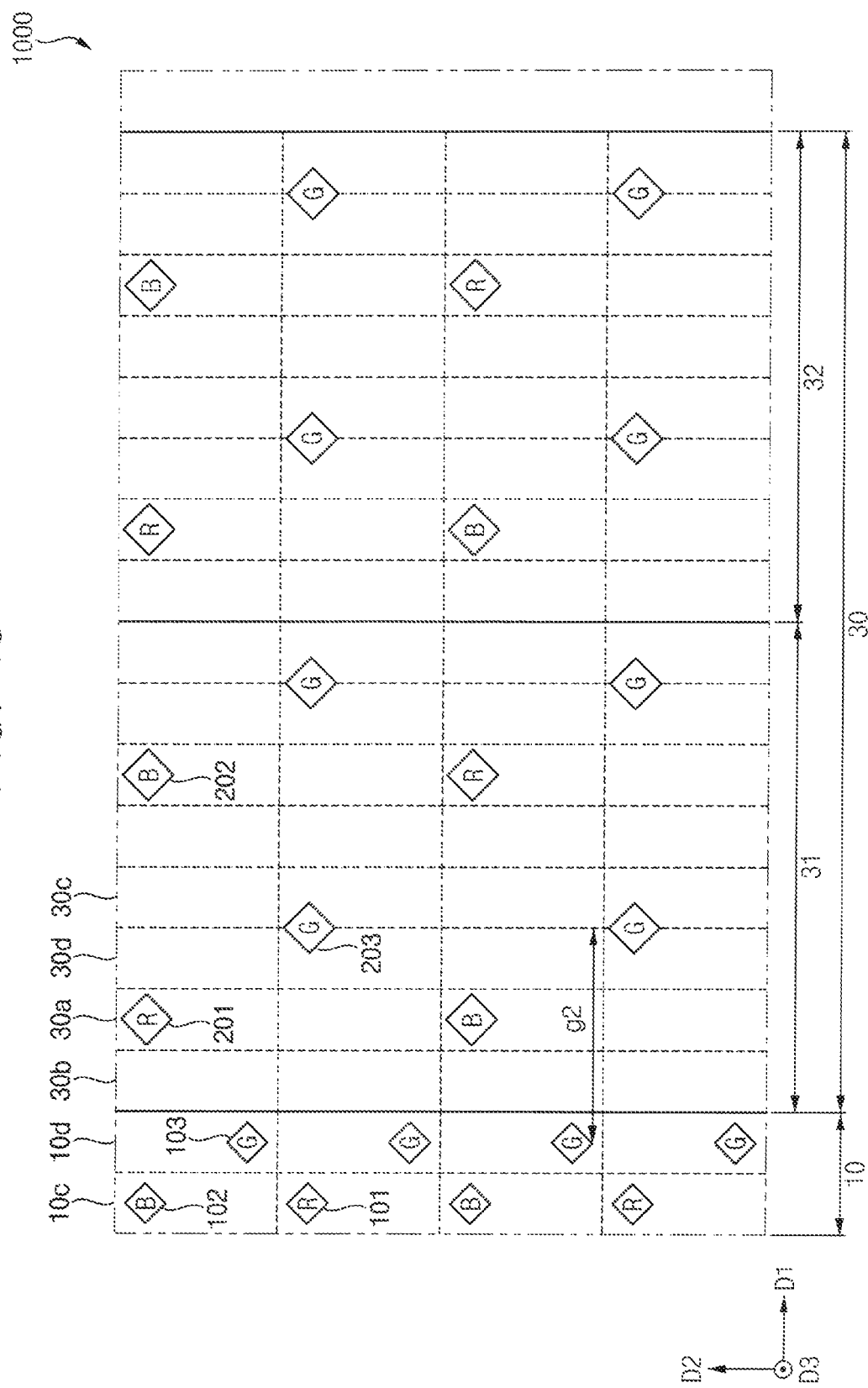

FIGS. 17 and 18 are plan views showing a display device according to embodiments. A display device 1000 illustrated in FIGS. 17 and 18 may have a configuration that is substantially identical or similar to the configuration of the display device 100 described with reference to FIGS. 1 to 6. In FIGS. 17 and 18, redundant descriptions of components that are substantially identical or similar to the components described with reference to FIGS. 1 to 6 will be omitted for sake of brevity. For example, FIG. 17 may correspond to a partially enlarged plan view showing the region A of FIG. 1, and FIG. 18 may correspond to a partially enlarged plan view showing the region B of FIG. 1.

Referring to FIGS. 17 and 18, the display device 1000 may be configured such that positions of the third sub-pixels 203 disposed in the first display area 20 and the second display area 30 are different as compared with the display device 100 shown in FIGS. 5 and 6.

For example, the third sub-pixels 203 disposed in the second row and the fourth row in the first display area 20 may be relatively shifted in the direction opposite to the first direction D1 (e.g., a direction from the second display area 30 to the first display area 20), and the third sub-pixels 203 disposed in the second row and the fourth row in the second display area 30 may be relatively shifted in the direction.

Since the first to third sub-pixels 101, 102, and 103 disposed in the display area 10 and the first to third sub-pixels 201, 202, and 203 disposed in the first and second display areas 20 and 30 are arranged in the PenTile™ scheme, a roughness index (R-index) has to be considered. When the R-index is high, an image quality defect such as a spot and a stripe may occur in the display device 1000. In particular, since a green sub-pixel has a great influence on the R-index, an interval between the third sub-pixel 103 and the third sub-pixel 203, which have a greatest influence on the R-index, has to be substantially identical or similar at the first boundary between the display area 10 and the first sub-area 21 and the second boundary between the display area 10 and the third sub-area 31.

In the embodiments, as shown in FIG. 17, a first sub-pixel column including the third sub-pixels 203 (e.g., the third sub-pixels 203 disposed at a boundary between the first column 20a and the fourth column 20d) may be disposed in the first sub-area 21 adjacent to the first boundary. As shown in FIG. 18, a second sub-pixel column including the third sub-pixels 203 (e.g., the third sub-pixels 203 disposed at a boundary between the third column 30c and the fourth column 30d) may be disposed in the third sub-area 31 adjacent to the second boundary. A distance g1 of the first sub-pixel column from the second column 10b of the display area 10 may be substantially equal to a distance g2 of the second sub-pixel column from the fourth column 10d of the display area 10.

In addition, a third sub-pixel column including the second and first sub-pixels 202 and 201 (e.g., the second and first sub-pixels disposed in the third column 20c) in the first sub-area 21 may be spaced apart from the first sub-pixel column in the direction from the display area 10 to the first display area 20. A fourth sub-pixel column including the third sub-pixels 203 (e.g., the third sub-pixels 203 disposed at a boundary between the fifth column and the eighth column) in the first sub-area 21 may be spaced apart from the third sub-pixel column in the direction. A fifth sub-pixel column including the first and second sub-pixels 201 and 203 (e.g., the first and second sub-pixels 201 and 203 disposed in the seventh column) in the first sub-area 21 may be spaced apart from the fourth sub-pixel column in the direction.

Moreover, a separation distance between the first sub-pixel column and the third sub-pixel column in the direction may be smaller than a separation distance between the third sub-pixel column and the fourth sub-pixel column in the direction.

Similarly, a sixth sub-pixel column including the first and second sub-pixels 201 and 202 (e.g., the first and second sub-pixels 201 and 202 disposed in the first column 30a) in the third sub-area 31 may be disposed between the fourth column 10d of the display area 10 and the second sub-pixel column. A seventh sub-pixel column including the second and first sub-pixels 202 and 201 (e.g., the second and first sub-pixels 202 and 201 disposed in the fifth column) in the third sub-area 31 may be spaced apart from the second sub-pixel column in a direction from the display area 10 to the third sub-area 31. An eighth sub-pixel column including the third sub-pixels 203 (e.g., the third sub-pixels 203 disposed at a boundary between the seventh and eighth columns) in the third sub-area 31 may be spaced apart from the seventh sub-pixel column in the direction. A separation distance between the second sub-pixel column and the sixth sub-pixel column in the direction may be smaller than a separation distance between the second sub-pixel column and the seventh sub-pixel column in the direction.

According the display device 1000 of the embodiments described herein, the distance g1 of the first sub-pixel column from the second column 10b of the display area 10 is substantially equal to the distance g2 of the second sub-pixel column from the fourth column 10d of the display area 10, so that a value of the R-index may be relatively reduced, and image quality of the display device 1000 may be relatively improved.

Figure 19:
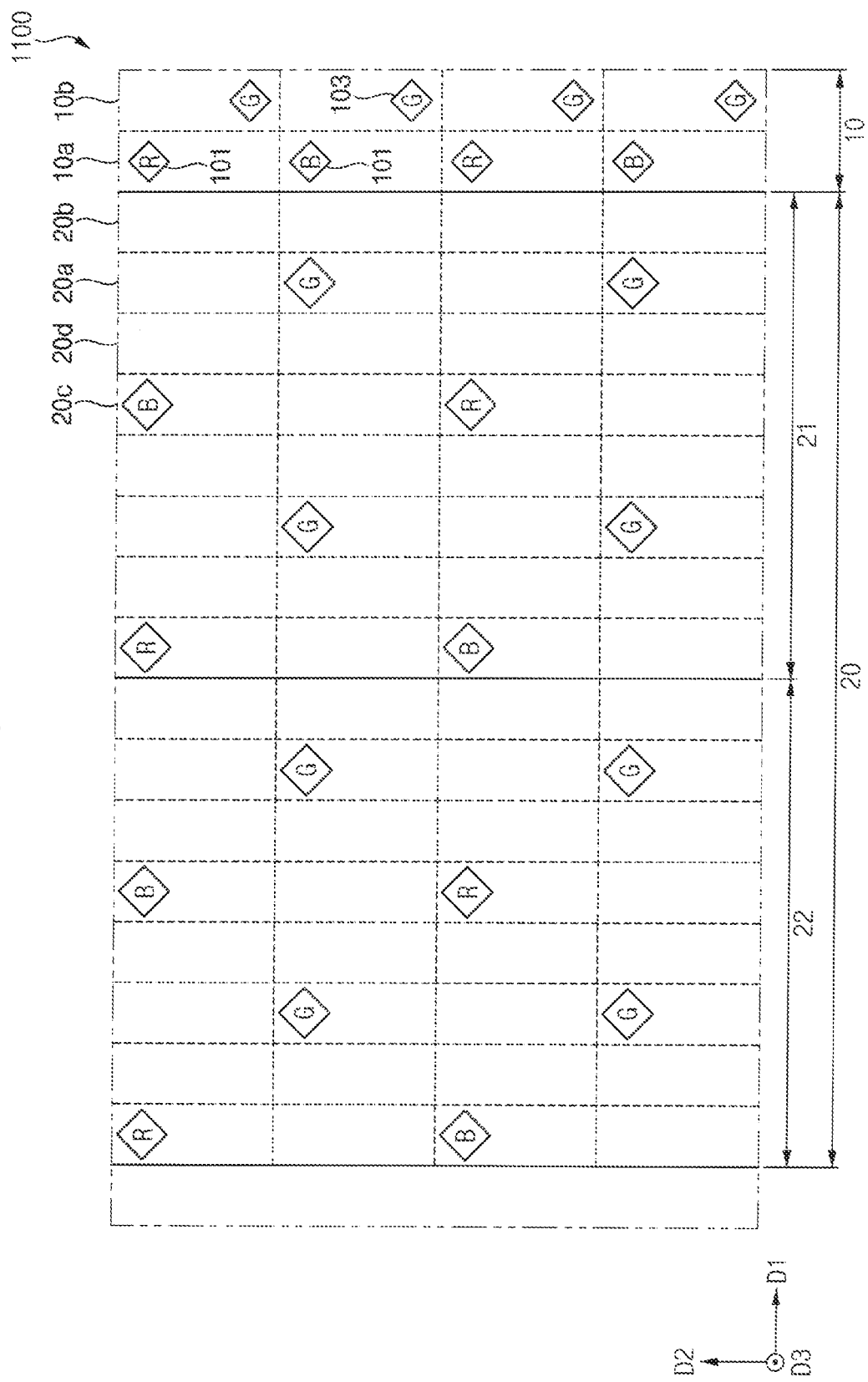
FIGS. 19 and 20 are plan views showing a display device according to embodiments of the inventive concepts.
Figure 20:
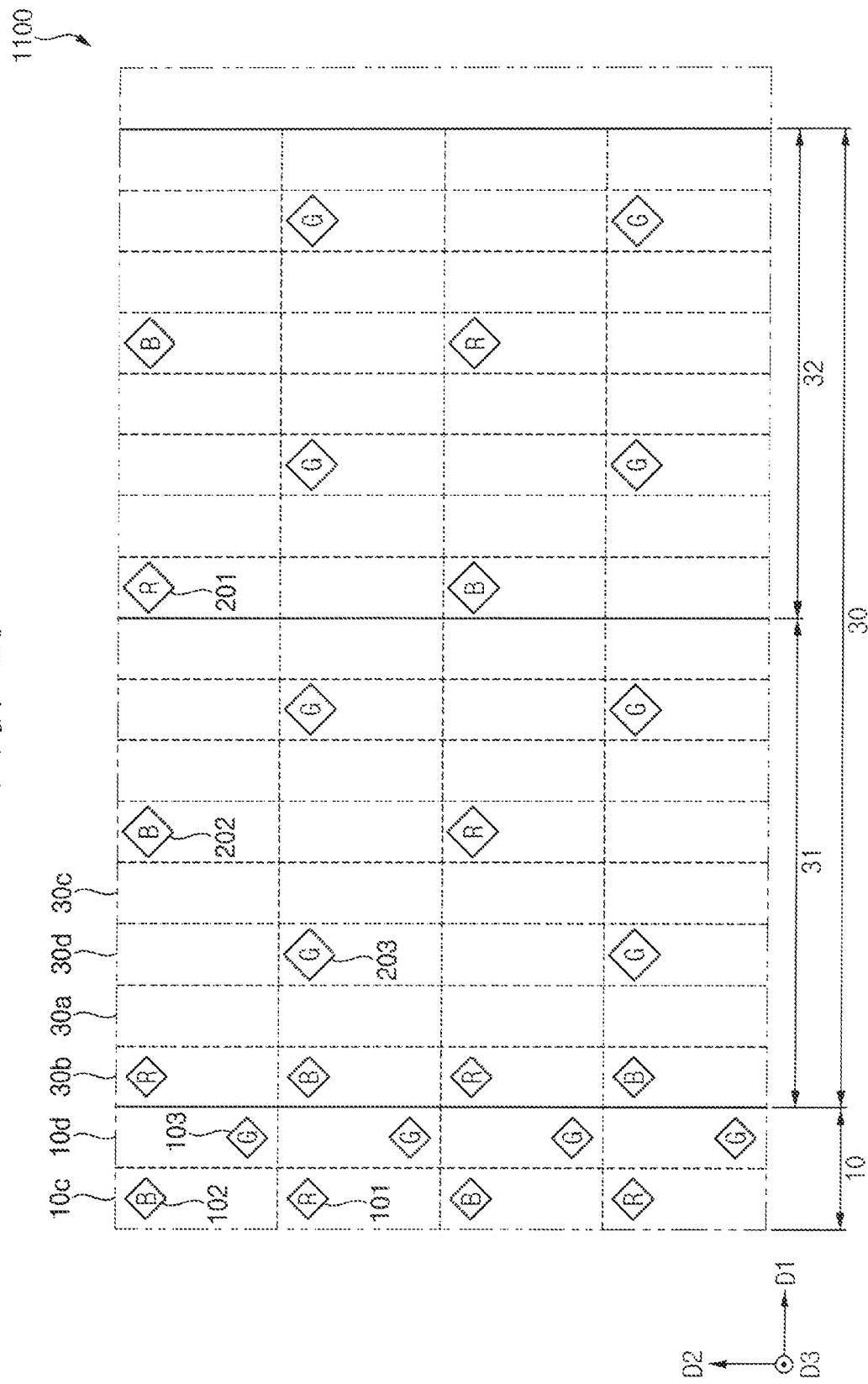

FIGS. 19 and 20 are plan views showing a display device according to embodiments. A display device 1100 illustrated in FIGS. 19 and 20 may have a configuration that is substantially identical or similar to the configuration of the display device 100 described with reference to FIGS. 1 to 6. In FIGS. 19 and 20, redundant descriptions of components that are substantially identical or similar to the components described with reference to FIGS. 1 to 6 will be omitted for sake of brevity. For example, FIG. 19 may correspond to a partially enlarged plan view showing the region A of FIG. 1, and FIG. 20 may correspond to a partially enlarged plan view showing the region B of FIG. 1.

Referring to FIGS. 19 and 20, when compared with the display device 100 shown in FIGS. 5 and 6, the display device 1100 may be configured such that a sub-pixel arrangement of the first and second sub-pixels 101 and 102 disposed in the first column 10a of the display area 10 is applied to the second column 30b of the third sub-area 31. In other words, arrangements of sub-pixels in a first column (e.g., the first column 10a) and a last column (the second column 30b) in the display area 10 may be the same. In addition, an arrangement of the first to third sub-pixels 201, 202, and 203 disposed in the first display area 20 and an arrangement of the first to third sub-pixels 201, 202, and 203 disposed in the second display area 30 may be symmetrical with each other.

In this case, the second column 30b of the third sub-area 31 may also be included in the display area 10, and a boundary between the second column 30b and the first column 30a of the third sub-area 31 may be defined as the second boundary between the display area 10 and the third sub-area 31. In addition, the fourth column 10d of the display area 10 may be defined as a third column of the display area 10, and the second column 30b of the third sub-area 31 may be defined as a fourth column of the display area 10. Moreover, the fourth column 30d of the third sub-area 31 may be defined as a first column of the third sub-area 31, and the first column 30a of the third sub-area 31 may be defined as a second column of the third sub-area 31.

An interval between the second column 10b of the display area 10 in which the third sub-pixels 103 are disposed and the first column 20a of the first sub-area 21 in which the third sub-pixels 203 are disposed may become equal to an interval between the fourth column 10d of the display area 10 in which the third sub-pixels 103 are disposed (i.e., the newly defined third column of the display area 10) and the fourth column 30d of the third sub-area 31 in which the third sub-pixels 203 are disposed (e.g., the newly defined first column of the third sub-area 31).

In addition, the first to third sub-pixels 201, 202, and 203 may not be disposed in the second column 20b of the first sub-area 21 and the first column 30a of the third sub-area 31 (e.g., the newly defined second column).

According to the display device 1100 of the embodiments as described herein, when the arrangements of the sub-pixels in the first column and the last column in the display area 10 are the same, and the arrangement of the sub-pixels disposed in the first display area 20 and the arrangement of the sub-pixels disposed in the second display area 30 are symmetrical with each other, the value of the R-index may be relatively reduced, and image quality of the display device 1100 may be relatively improved. In addition, a defect may not occur in the process of forming the light emitting layer of each of the first to third sub-pixels 201, 202, and 203 that are adjacent to the first and second boundaries.

Figure 21:
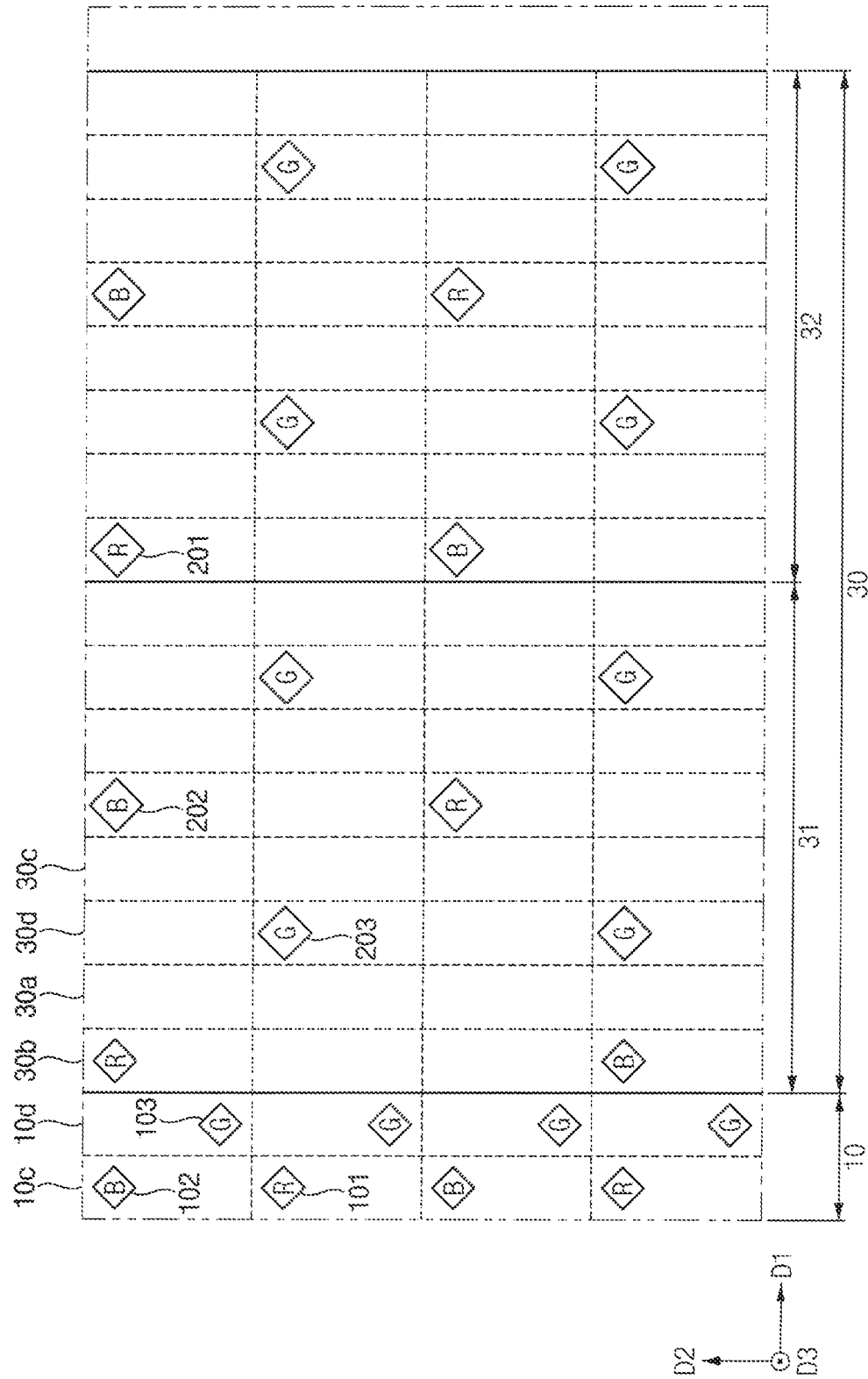
FIG. 21 is a plan view showing one example of an arrangement of sub-pixels included in the display device of FIGS. 19 and 20.

FIG. 21 is a plan view showing one example of an arrangement of sub-pixels included in the display device of FIGS. 19 and 20.

Referring to FIG. 21, when compared with a sub-pixel arrangement provided in the second column 30b of the third sub-area 31 of the display device 1100 of FIGS. 19 and 20, FIG. 21 shows a configuration in which the first sub-pixel 101 may be disposed in the first row and the second column 30b of the third sub-area 31, and the second sub-pixel 102 may be disposed in the fourth row and the second column 30b of the third sub-area 31. In other words, a sub-pixel may not be disposed in the second and third rows in the second column 30b. In other embodiments, a sub-pixel may be disposed only in at least one of the first to fourth rows in the second column 30b.

The embodiments described herein may be applied to various electronic devices including a display device. For example, the embodiments described herein may be applied to numerous electronic devices such as vehicle-display devices, ship-display devices, aircraft-display devices, portable communication devices, exhibition display devices, information transfer display devices, medical-display devices, etc.

The foregoing is illustrative of embodiments and is not to be construed as limiting thereof.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device including a display area, a first display area located in one side of the display area and including a first sub-area and a second sub-area, and a second display area located in an opposite side of the display area and including a third sub-area and a fourth sub-area, the display device comprising:
    a substrate; and
    a plurality of first sub-pixels, second sub-pixels, and third sub-pixels disposed in the display area, the first display area, and the second display area on the substrate,
    wherein the plurality of first and second sub-pixels are repeatedly arranged in a first column of the display area that is adjacent to a first boundary between the display area and the first sub-area, and the plurality of third sub-pixels are arranged in a second column of the display area,
    the plurality of second and first sub-pixels are repeatedly arranged in a third column of the display area that is adjacent to a second boundary between the display area and the third sub-area, and the plurality of third sub-pixels are arranged in a fourth column of the display area,
    the plurality of third sub-pixels are arranged in a first column of the first sub-area that is adjacent to the first boundary, and a second column of the first sub-area is located between the first boundary and the first column of the first sub-area,
    the plurality of first and second sub-pixels are arranged in a first column of the third sub-area that is adjacent to the second boundary, and a second column of the third sub-area is located between the second boundary and the first column of the third sub-area, and
    the plurality of first to third sub-pixels are not disposed in the second column of the first sub-area and the second column of the third sub-area.

2. The display device of claim 1, wherein a third column of the first sub-area is adjacent to the first column of the first sub-area, and a fourth column of the first sub-area is located between the first and third columns of the first sub-area, and
    the plurality of second and first sub-pixels are arranged in the third column of the first sub-area.

3. The display device of claim 2, wherein the plurality of first to third sub-pixels are not disposed in the fourth column of the first sub-area.

4. The display device of claim 1, wherein the plurality of first to third sub-pixels are arranged in a zigzag shape in an order of the first sub-pixel, the third sub-pixel, the second sub-pixel, and the third sub-pixel in the first and second columns of the display area.

5. The display device of claim 1, wherein a third column of the third sub-area is adjacent to the first column of the third sub-area, and a fourth column of the third sub-area is located between the first and third columns of the third sub-area, and
    the plurality of third sub-pixels are arranged in the third column of the third sub-area.

6. The display device of claim 5, wherein the plurality of first to third sub-pixels are not disposed in the fourth column of the third sub-area.

7. The display device of claim 1, wherein the plurality of first to third sub-pixels are arranged in a zigzag shape in an order of the second sub-pixel, the third sub-pixel, the first sub-pixel, and the third sub-pixel in the third and fourth columns of the display area.

8. The display device of claim 1, further comprising:
    a first circuit structure disposed in the second sub-area on the substrate.

9. The display device of claim 8, further comprising:
    a plurality of first, second, and third pixel circuits connected to the first to third sub-pixels disposed in the display area, the first display area, and the second display area, in which the plurality of first, second, and third pixel circuits are connected to the plurality of first to third sub-pixels, respectively,
    wherein the plurality of first to third pixel circuits connected to the plurality of first to third sub-pixels disposed in the second sub-area, respectively, are disposed in the first sub-area.

10. The display device of claim 1, further comprising:
    a second circuit structure disposed in the fourth sub-area on the substrate.

11. The display device of claim 10, further comprising:
    a plurality of first, second, and third pixel circuits connected to the plurality of first to third sub-pixels disposed in the display area, the first display area, and the second display area, in which the plurality of first, second, and third pixel circuits are connected to the plurality of first to third sub-pixels, respectively, wherein the plurality of first to third pixel circuits connected to the plurality of first to third sub-pixels disposed in the fourth sub-area, respectively, are disposed in the third sub-area.

12. The display device of claim 1, wherein a number of the plurality of first and second sub-pixels arranged in the first column of the display area is equal to a number of the plurality of third sub-pixels arranged in the second column of the display area, and
a number of the plurality of third sub-pixels arranged in the first column of the first sub-area is smaller than the number of the plurality of first and second sub-pixels arranged in the first column of the display area.

13. The display device of claim 12, wherein the number of the plurality of third sub-pixels arranged in the first column of the first sub-area is half the number of the plurality of first and second sub-pixels arranged in the first column of the display area.

14. The display device of claim 1, wherein the first display area and the second display area are parallel to each other to face each other,
the second and third columns of the display area are located between the first and fourth columns of the display area, the second column of the first sub-area is located between the first column of the display area and the first column of the first sub-area, and the second column of the third sub-area is located between the fourth column of the display area and the first column of the third sub-area, and
sizes of the plurality of first to third sub-pixels disposed in the first and second display areas are greater than sizes of the plurality of first to third sub-pixels disposed in the display area, respectively.

15. A display device including a display area, a first display area located in one side of the display area and including a first sub-area and a second sub-area, and a second display area located in an opposite side of the display area and including a third sub-area and a fourth sub-area, the display device comprising:
a substrate; and
a plurality of first sub-pixels, second sub-pixels, and third sub-pixels disposed in the display area, the first display area, and the second display area on the substrate,
wherein the plurality of first and second sub-pixels are repeatedly arranged in a first column of the display area that is adjacent to a first boundary between the display area and the first sub-area, and the plurality of third sub-pixels are arranged in a second column of the display area,
the plurality of second and first sub-pixels are repeatedly arranged in a third column of the display area that is adjacent to a second boundary between the display area and the third sub-area, and the plurality of third sub-pixels are arranged in a fourth column of the display area,
a first sub-pixel column including the third sub-pixels is disposed in the first sub-area that is adjacent to the first boundary,
a second sub-pixel column including the third sub-pixels is disposed in the third sub-area that is adjacent to the second boundary, and
a distance where the first sub-pixel column is spaced apart from the second column of the display area is equal to a distance where the second sub-pixel column is spaced apart from the fourth column of the display area.

16. The display device of claim 15, further comprising:
a third sub-pixel column spaced apart from the first sub-pixel column in a direction from the display area to the first display area in the first sub-area, and including the plurality of second and first sub-pixels;
a fourth sub-pixel column spaced apart from the third sub-pixel column in the direction in the first sub-area, and including the plurality of third sub-pixels; and
a fifth sub-pixel column spaced apart from the fourth sub-pixel column in the direction in the first sub-area, and including the plurality of first and second sub-pixels.

17. The display device of claim 16, wherein a separation distance between the first sub-pixel column and the third sub-pixel column in the direction is smaller than a separation distance between the third sub-pixel column and the fourth sub-pixel column in the direction.

18. The display device of claim 15, further comprising:
a sixth sub-pixel column disposed between the fourth column of the display area and the second sub-pixel column in the third sub-area, and including the plurality of first and second sub-pixels;
a seventh sub-pixel column spaced apart from the second sub-pixel column in a direction from the display area to the third sub-area in the third sub-area, and including the plurality of second and first sub-pixels; and
an eighth sub-pixel column spaced apart from the seventh sub-pixel column in the direction in the third sub-area, and including the plurality of third sub-pixels.

19. The display device of claim 18, wherein a separation distance between the second sub-pixel column and the sixth sub-pixel column in the direction is smaller than a separation distance between the second sub-pixel column and the seventh sub-pixel column in the direction.

20. A display device including a display area, a first display area located in one side of the display area and including a first sub-area and a second sub-area, and a second display area located in an opposite side of the display area and including a third sub-area and a fourth sub-area, the display device comprising:
a substrate; and
a plurality of first sub-pixels, second sub-pixels, and third sub-pixels disposed in the display area, the first display area, and the second display area on the substrate,
wherein the plurality of first and second sub-pixels are repeatedly arranged in a first column of the display area that is adjacent to a first boundary between the display area and the first sub-area, and the plurality of third sub-pixels are arranged in a second column of the display area,
the plurality of third sub-pixels are repeatedly arranged in a third column of the display area that is adjacent to a second boundary between the display area and the third sub-area, and the plurality of first and second sub-pixels are repeatedly arranged in a fourth column of the display area,
the plurality of third sub-pixels are arranged in a first column of the first sub-area that is adjacent to the first boundary, and a second column of the first sub-area is located between the first boundary and the first column of the first sub-area,
the plurality of third sub-pixels are arranged in a first column of the third sub-area that is adjacent to the second boundary, and a second column of the third sub-area is located between the second boundary and the first column of the third sub-area, and the plurality of first to third sub-pixels are not disposed in the second column of the first sub-area and the second column of the third sub-area.

* * * * *